United States Patent
White

(10) Patent No.: US 11,545,595 B2
(45) Date of Patent: Jan. 3, 2023

(54) CONTACT STRUCTURES FOR LIGHT EMITTING DIODE CHIPS

(71) Applicant: CreeLED, Inc., Newark, CA (US)

(72) Inventor: Justin White, Morrisville, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 17/220,051

(22) Filed: Apr. 1, 2021

(65) Prior Publication Data

US 2021/0217931 A1    Jul. 15, 2021

Related U.S. Application Data

(62) Division of application No. 16/357,949, filed on Mar. 19, 2019, now Pat. No. 10,985,294.

(51) Int. Cl.
*H01L 33/38* (2010.01)
*H01L 33/22* (2010.01)
(Continued)

(52) U.S. Cl.
CPC .............. *H01L 33/38* (2013.01); *H01L 33/22* (2013.01); *H01L 33/24* (2013.01); *H01L 33/405* (2013.01);
(Continued)

(58) Field of Classification Search
CPC ......... H01L 33/38; H01L 33/22; H01L 33/24; H01L 33/405; H01L 33/44; H01L 33/46;
(Continued)

(56) References Cited

U.S. PATENT DOCUMENTS

| 5,739,554 A | 4/1998 | Edmond et al. |
| 6,657,236 B1 | 12/2003 | Thibeault et al. |

(Continued)

FOREIGN PATENT DOCUMENTS

| CN | 104037277 A | 9/2014 |
| CN | 107452846 A | 12/2017 |

(Continued)

OTHER PUBLICATIONS

Examination Report for Indian Patent Application No. 202117029185, dated Mar. 25, 2022, 6 pages.

(Continued)

*Primary Examiner* — Shahed Ahmed
(74) *Attorney, Agent, or Firm* — Withrow & Terranova, P.L.L.C.

(57) ABSTRACT

Solid-state lighting devices including light-emitting diodes (LEDs) and more particularly contact structures for LED chips are disclosed. LED chips as disclosed herein may include contact structure arrangements that have reduced impact on areas of active LED structures within the LED chips. Electrical connections between an n-contact and an n-type layer may be arranged outside of a perimeter edge or a perimeter corner of the active LED structure. N-contact interconnect configurations are disclosed that form electrical connections between n-contacts and n-type layers of LED chips outside of lateral boundaries of the active LED structures. By electrically contacting n-type layers outside of the lateral boundaries of the active LED structures, LED chips are provided with improved current spreading and improved brightness.

20 Claims, 13 Drawing Sheets

(51) Int. Cl.
 *H01L 33/24* (2010.01)
 *H01L 33/44* (2010.01)
 *H01L 33/46* (2010.01)
 *H01L 33/40* (2010.01)

(52) U.S. Cl.
 CPC .............. *H01L 33/44* (2013.01); *H01L 33/46* (2013.01); *H01L 2933/0016* (2013.01); *H01L 2933/0025* (2013.01)

(58) Field of Classification Search
 CPC ..... H01L 2933/0016; H01L 2933/0025; H01L 33/00–648; H01L 27/15–156; H01L 2933/00–0091; H01L 33/62; H01L 33/387
 See application file for complete search history.

(56) References Cited

U.S. PATENT DOCUMENTS

| | | | |
|---|---|---|---|
| 6,747,298 B2 | 6/2004 | Slater, Jr. et al. | |
| 6,784,462 B2 | 8/2004 | Schubert | |
| 6,791,119 B2 | 9/2004 | Slater, Jr. et al. | |
| 6,821,804 B2 | 11/2004 | Thibeault et al. | |
| 6,888,167 B2 | 5/2005 | Slater, Jr. et al. | |
| 7,211,803 B1 | 5/2007 | Dhurjaty et al. | |
| 7,326,967 B2 | 2/2008 | Hsieh et al. | |
| 7,622,746 B1 | 11/2009 | Lester et al. | |
| 7,829,906 B2 | 11/2010 | Donofrio | |
| 7,880,181 B2 | 2/2011 | Yoon et al. | |
| 7,915,629 B2 | 3/2011 | Li et al. | |
| 8,017,963 B2 | 9/2011 | Donofrio et al. | |
| 8,212,273 B2 | 7/2012 | McKenzie et al. | |
| 8,368,100 B2 | 2/2013 | Donofrio et al. | |
| 8,471,280 B2 | 6/2013 | Aldaz et al. | |
| D691,973 S | 10/2013 | Donofrio et al. | |
| 8,575,633 B2 | 11/2013 | Donofrio et al. | |
| 8,598,609 B2 | 12/2013 | Ibbetson et al. | |
| 8,643,039 B2 | 2/2014 | Donofrio et al. | |
| 8,680,556 B2 | 3/2014 | Ibbetson et al. | |
| 8,710,536 B2 | 4/2014 | Ibbetson et al. | |
| 8,866,169 B2 | 10/2014 | Emerson et al. | |
| 8,940,561 B2 | 1/2015 | Donofrio et al. | |
| 9,000,470 B2 | 4/2015 | Tudorica et al. | |
| 9,070,850 B2 | 6/2015 | Keller et al. | |
| 9,362,459 B2 | 6/2016 | Heikman et al. | |
| 9,412,907 B1 | 8/2016 | Place et al. | |
| 9,461,201 B2 | 10/2016 | Heikman et al. | |
| 9,887,327 B2 | 2/2018 | Reiherzer | |
| 10,236,414 B2 | 3/2019 | Lee et al. | |
| 10,879,441 B2 | 12/2020 | Check | |
| 2003/0025212 A1 | 2/2003 | Bhat et al. | |
| 2003/0230754 A1 | 12/2003 | Steigerwald et al. | |
| 2005/0255619 A1 | 11/2005 | Negro et al. | |
| 2005/0274956 A1 | 12/2005 | Bhat | |
| 2008/0179611 A1 | 7/2008 | Chitnis et al. | |
| 2008/0246047 A1 | 10/2008 | Hsu et al. | |
| 2009/0146165 A1 | 6/2009 | Hasnain et al. | |
| 2009/0283787 A1 | 11/2009 | Donofrio et al. | |
| 2010/0140635 A1 | 6/2010 | Ibbetson et al. | |
| 2011/0149211 A1 | 6/2011 | Ha et al. | |
| 2011/0305021 A1 | 12/2011 | Xin | |
| 2012/0049219 A1 | 3/2012 | Kamiya et al. | |
| 2012/0049756 A1 | 3/2012 | Schubert | |
| 2012/0074441 A1 | 3/2012 | Seo et al. | |
| 2012/0193660 A1 | 8/2012 | Donofrio et al. | |
| 2012/0193662 A1 | 8/2012 | Donofrio et al. | |
| 2012/0326159 A1 | 12/2012 | Bergmann et al. | |
| 2013/0058102 A1 | 3/2013 | Lin | |
| 2013/0141920 A1 | 6/2013 | Emerson et al. | |
| 2013/0264592 A1 | 10/2013 | Bergmann et al. | |
| 2013/0328096 A1 | 12/2013 | Donofrio et al. | |
| 2013/0341634 A1 | 12/2013 | Heikman et al. | |
| 2014/0070245 A1 | 3/2014 | Haberern et al. | |
| 2014/0203320 A1 | 7/2014 | Ibbetson et al. | |
| 2015/0140710 A1* | 5/2015 | McLaurin ............. H01S 5/0217 438/31 |
| 2015/0179879 A1* | 6/2015 | Yang ....................... H01L 33/46 257/98 |
| 2015/0179903 A1 | 6/2015 | Pun et al. | |
| 2015/0295138 A1 | 10/2015 | Chae et al. | |
| 2015/0380621 A1 | 12/2015 | Chae et al. | |
| 2016/0155901 A1* | 6/2016 | Lopez ..................... H01L 33/32 257/13 |
| 2016/0211420 A1 | 7/2016 | Donofrio et al. | |
| 2016/0260869 A1 | 9/2016 | Jeon et al. | |
| 2017/0012175 A1 | 1/2017 | Wang et al. | |
| 2017/0084787 A1 | 3/2017 | Emura et al. | |
| 2017/0098746 A1 | 4/2017 | Bergmann et al. | |
| 2017/0108173 A1 | 4/2017 | Kim et al. | |
| 2017/0149211 A1 | 5/2017 | Jeong et al. | |
| 2017/0210277 A1 | 7/2017 | Harada et al. | |
| 2017/0294417 A1* | 10/2017 | Edmond ............... H01L 33/502 |
| 2017/0294418 A1 | 10/2017 | Edmond et al. | |
| 2017/0331009 A1 | 11/2017 | Shioji | |
| 2018/0114878 A1* | 4/2018 | Danesh .................. H01L 33/62 |
| 2018/0254386 A1 | 9/2018 | Perzlmaier et al. | |
| 2019/0051805 A1* | 2/2019 | Oh .......................... H01L 33/10 |
| 2019/0237630 A1 | 8/2019 | Check | |

FOREIGN PATENT DOCUMENTS

| | | |
|---|---|---|
| CN | 107546303 A | 1/2018 |
| WO | 2012086483 A1 | 6/2012 |

OTHER PUBLICATIONS

Notice of Allowance and Examiner-Initiated Interview Summary for U.S. Appl. No. 16/963,533, dated Feb. 23, 2022, 7 pages.
Non-Final Office Action for U.S. Appl. No. 16/963,533, dated Nov. 12, 2021, 10 pages.
Notice of Allowance for U.S. Appl. No. 17/004,486, dated Jan. 10, 2022, 9 pages.
Author Unknown, "Cree® XLamp® XB-D and Xt-E LED Optical Design Considerations," Application Note, CLD-AP104 Rev 0B, www.cree.com/Xlamp, 2014, Cree, Inc., pp. 1-15.
Carey, Julian, "New LED architectures and phosphor technologies lower costs and boost quality," (Magazine), LED Design & Manufacturing, vol. 11, Issue 7, Sep. 4, 2014, Tulsa, OK, PennWell Corporation, pp. 1-16.
Kim, Jong Kyu et al., "GaInN light-emitting diodes with $RuO_2$/$SiO_2$/Ag omni-directional reflector," Applied Physics Letters, vol. 84, Issue 22, May 31, 2004, American Institute of Physics, pp. 4508-4510.
Palik, E. D., ed., "Handbook of Optical Constants of Solids: vol. One," Academic Press, 1985, 785 pages.
Wright, Maury, "Strategies in Light to span SSL technology and business domains," (Magazine), SSL Design, vol. 12, Issue 2, Feb. 16, 2015, Tulsa, OK, PennWell Corporation, pp. 1-22.
Non-Final Office Action for U.S. Appl. No. 15/280,438, dated May 8, 2018, 26 pages.
International Search Report and Written Opinion for International Patent Application No. PCT/US2016/054372, dated Dec. 19, 2016, 16 pages.
International Preliminary Report on Patentability for International Patent Application No. PCT/US2016/054372, dated Apr. 3, 2018, 9 pages.
Bruschi, Lorenzo et al., "Adsorption in alumina pores open at one and at both ends," Nanoscale, vol. 7, Issue 6, Feb. 14, 2015, Royal Society of Chemistry, pp. 2587-2596.
Bruschi, Lorenzo et al., "Supporting Information: Adsorption in alumina pores open at one and at both ends," Electronic Supplementary Material (ESI) for Nanoscale, 2014, http://www.rsc.org/suppdata/nr/c4/c4nr06469k/c4nr06469k1.pdf, Royal Society of Chemistry, 3 pages.
Zhao, S. et al., "Enhanced luminous efficiency of phosphor-converted LEDs by using back reflector to increase reflectivity for yellow light," Applied Optics, vol. 53, No. 34, Dec. 1, 2014, Optical Society of America, pp. 8104-8110.

(56) References Cited

OTHER PUBLICATIONS

Zhao, Y.S. et al., "Efficiency Enhancement of InGaN/GaN Light-Emitting Diodes with a Back-Surface Distributed Bragg Reflector," Journal of Electronic Materials, vol. 32, No. 12, 2003, Springer-Verlag, pp. 1523-1526.
Final Office Action for U.S. Appl. No. 15/280,438, dated Nov. 1, 2018, 26 pages.
Advisory Action, Interview Summary, and AFCP 2.0 Decision for U.S. Appl. No. 15/280,438, dated Dec. 13, 2018, 7 pages.
Non-Final Office Action and Examiner-Initiated Interview Summary for U.S. Appl. No. 15/280,438, dated May 3, 2019, 23 pages.
Final Office Action and Examiner-Initiated Interview Summary for U.S. Appl. No. 15/280,438, dated Sep. 13, 2019, 23 pages.
Examination Report for European Patent Application No. 16778642.5, dated Apr. 26, 2019, 5 pages.
Non-Final Office Action for U.S. Appl. No. 15/882,103, dated Aug. 20, 2019, 16 pages.
International Search Report and Written Opinion for International Patent Application No. PCT/US2019/015418, dated May 14, 2019, 19 pages.
Advisory Action, Interview Summary, and AFCP 2.0 Decision for U.S. Appl. No. 15/280,438, dated Nov. 27, 2019, 6 pages.
Non-Final Office Action for U.S. Appl. No. 15/280,438, dated Jan. 22, 2020, 17 pages.
Non-Final Office Action and Examiner-Initiated Interview Summary for U.S. Appl. No. 15/280,438, dated Jul. 7, 2020, 22 pages.
Notification of First Office Action for Chinese Patent Application No. 201680070374.8, dated Feb. 6, 2020, 13 pages.
Intention to Grant for European Patent Application No. 16778642.5, dated Feb. 27, 2020, 93 pages.
Final Office Action for U.S. Appl. No. 15/882,103, dated Feb. 6, 2020, 23 pages.
Advisory Action, Examiner-Initiated Interview Summary, and AFCP 2.0 Decision for U.S. Appl. No. 15/882,103, dated Mar. 16, 2020, 7 pages.
Non-Final Office Action for U.S. Appl. No. 15/882,103, dated Jun. 15, 2020, 14 pages.
Non-Final Office Action for U.S. Appl. No. 15/882,103, dated Jun. 17, 2020, 14 pages.
International Preliminary Report on Patentability for International Patent Application No. PCT/US2019/015418, dated Aug. 13, 2020, 12 pages.
Non-Final Office Action for U.S. Appl. No. 16/222,173, dated Feb. 14, 2020, 13 pages.
Notice of Allowance for U.S. Appl. No. 16/222,173, dated May 29, 2020, 10 pages.
International Search Report and Written Opinion for International Patent Application No. PCT/US2019/059331, dated Jan. 27, 2020, 19 pages.
Final Office Action for U.S. Appl. No. 16/357,949, dated Sep. 30, 2020, 9 pages.
Non-Final Office Action for U.S. Appl. No. 16/357,949, dated Jun. 10, 2020, 10 pages.
Notice of Allowance for U.S. Appl. No. 15/280,438, dated Dec. 23, 2020, 9 pages.
Notification of the Second Office Action for Chinese Patent Application No. 201680070374.8, dated Sep. 25, 2020, 15 pages.
Ex-Parte Quayle Action for U.S. Appl. No. 15/882,103, mailed Dec. 11, 2020, 6 pages.
Notice of Allowance for U.S. Appl. No. 15/882,103, dated Feb. 18, 2021, 9 pages.
International Preliminary Report on Patentability for International Patent Application No. PCT/US2019/059331, dated Jul. 1, 2021, 12 pages.
Notice of Allowance for U.S. Appl. No. 16/357,949, dated Dec. 24, 2020, 8 pages.
Corrected Notice of Allowability for U.S. Appl. No. 16/542,458, dated May 18, 2021, 6 pages.
Notice of Allowance for U.S. Appl. No. 16/542,458, dated Apr. 19, 2021, 8 pages.
Non-Final Office Action for U.S. Appl. No. 16/542,458, dated Nov. 23, 2020, 9 pages.

\* cited by examiner

A6-A6

CONTACT STRUCTURES FOR LIGHT EMITTING DIODE CHIPS

RELATED APPLICATIONS

This application is a division of U.S. patent application Ser. No. 16/357,949, filed Mar. 19, 2019, now U.S. Pat. No. 10,985,294, the disclosure of which is hereby incorporated herein by reference in its entirety.

FIELD OF THE DISCLOSURE

The present disclosure relates to solid-state lighting devices including light-emitting diodes (LEDs) and more particularly to LED chips and related methods.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

Typically, it is desirable to operate LEDs at the highest light emission efficiency, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment will be either refracted or internally reflected. If photons are internally reflected in a repeated manner, then such photons will eventually be absorbed and never provide visible light that exits an LED. To increase the opportunity for photons to exit an LED, it has been found useful to pattern, roughen, or otherwise texture the interface between an LED surface and the surrounding environment to provide a varying surface that increases the probability of refraction over internal reflection and thus enhances light extraction. Reflective surfaces may also be provided to reflect generated light so that such light may contribute to useful emission from an LED chip. LEDs have been developed with internal reflective surfaces or layers to reflect generated light.

The quantum efficiency of an LED can also be limited by other factors, such as how well current is able to spread within an LED. To increase current spreading for LEDs, and in particular for larger area LEDs, it has been found useful to add layers of high electrical conductivity over one or more epitaxial layers of an LED. Additionally, electrodes for LEDs can have larger surface areas and may include various electrode extensions or fingers that are configured to route and more evenly distribute current across an LED.

As advancements in modern LED technology progress, the art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs) and more particularly to contact structures for LED chips. LED chips as disclosed herein may include contact structure arrangements that have reduced impact on areas of active LED structures within the LED chips. Active LED structures typically include an active layer that is arranged between an n-type layer and a p-type layer. In certain embodiments, contact structures include an n-contact and electrical connections between the n-contact and the n-type layer that are arranged outside of a perimeter edge or a perimeter corner of the active LED structure. In certain embodiments, n-contact interconnect configurations are disclosed that form electrical connections between n-contacts and n-type layers of LED chips outside of lateral boundaries of the active LED structures. By electrically contacting n-type layers outside of the lateral boundaries of the active LED structures, LED chips are provided with improved current spreading and improved brightness. In certain embodiments, n-contact interconnects may be configured to extend across or cover areas of the active LED structure. In certain embodiments, contact structures may include p-contact interconnect configurations that form electrical connections between p-contacts and p-type layers of LED chips. The p-contact interconnects may extend across or cover different areas of the active LED structure than the n-contact interconnects.

In one aspect, an LED chip comprises: an active structure comprising an n-type layer, a p-type layer, and an active layer arranged between the n-type layer and the p-type layer, wherein the p-type layer, the active layer, and a portion of the n-type layer form an active LED structure mesa; a p-contact electrically connected to the p-type layer; and an n-contact electrically connected to the n-type layer outside a lateral boundary of the active LED structure mesa, wherein at least a portion of the p-type layer is arranged between the n-contact and the n-type layer. In certain embodiments, the n-contact electrically connects with the n-type layer adjacent to a corner of the active LED structure mesa. The n-contact may electrically connect with the n-type layer adjacent to a plurality of corners of the active LED structure mesa. In certain embodiments, the n-contact electrically connects with the n-type layer adjacent to a corner of the active LED structure mesa and adjacent to a lateral edge of the active LED structure mesa. The LED chip may further comprise a passivation layer between the n-contact and the p-type layer. In certain embodiments, the LED chip further comprises an n-contact interconnect electrically connected between the n-contact and the n-type layer. At least a portion of the n-contact interconnect may be embedded in the passivation layer. In certain embodiments, the n-contact interconnect electrically connects with a surface of the n-type layer that is outside of the active LED structure mesa and the n-contact interconnect electrically connects with a lateral sidewall of the n-type layer. In certain embodiments, the n-contact interconnect is configured to extend in a first direction within the passivation layer and a second direction within the passivation layer that is nonparallel with the first direction. The LED chip may further comprise a light-transmissive substrate, wherein the active LED structure mesa is arranged between the light-transmissive substrate and both of the p-contact and the n-contact. In certain embodiments, a surface of the n-type layer comprises a textured or patterned surface. The LED chip may further comprise a carrier submount, wherein the active LED structure mesa is on a first face of the carrier submount and the n-contact is on a second face of the carrier submount that is opposite the first face. In certain embodiments, the p-contact is adjacent to the active LED structure mesa on the first face of the carrier submount. In certain embodiments, the LED chip may further comprise a reflective structure on the p-type layer, wherein the reflective structure comprises a dielectric reflective layer and a metal reflective layer. The metal reflective layer may form a plurality of reflective layer interconnects that extend through an entire thickness of the dielectric reflective layer. In certain embodiments, a first n-contact interconnect is electrically connected between the n-contact and the n-type layer outside a lateral boundary of the active LED structure mesa and a second n-contact interconnect is electrically connected between the n-contact and the n-type layer within lateral boundaries of the active LED structure mesa.

In another aspect, an LED chip comprises an active structure comprising an n-type layer, a p-type layer, and an active layer arranged between the n-type layer and the p-type layer; a passivation layer on a face of the active structure; an n-contact and a p-contact on the passivation layer; an n-contact interconnect electrically connected between the n-contact and the n-type layer, wherein the n-contact interconnect is configured to laterally extend within the passivation layer; and a p-contact interconnect electrically connected between the p-contact and the p-type layer, wherein the p-contact interconnect is configured to laterally extend within the passivation layer. In certain embodiments, the p-type layer, the active layer, and a portion of the n-type layer form an active LED structure mesa, and a least a portion of the n-type layer is uncovered by the active LED structure mesa. In certain embodiments, the portion of the n-type layer that is uncovered by the active LED structure mesa forms an at least partial circular shape. In certain embodiments, the at least partial circular shape comprises a quarter circle. The n-contact interconnect may be electrically connected to the n-type layer adjacent a corner of the active LED structure mesa. The n-contact interconnect may be electrically connected to the n-type layer adjacent a plurality of corners of the active LED structure mesa. The n-contact interconnect may be electrically connected to the n-type layer adjacent a lateral edge of the active LED structure mesa. In certain embodiments, the n-contact interconnect is electrically connected to the n-type layer adjacent a plurality of lateral edges of the active LED structure mesa. In certain embodiments, the n-contact interconnect is electrically connected to the n-type layer adjacent a corner of the active LED structure mesa and adjacent a lateral edge of the active LED structure mesa. In certain embodiments, n-contact interconnect laterally extends to cover an area that is greater than half the area of the active LED structure mesa. The p-contact interconnect may laterally extend to cover an area that is less than half the area of the active LED structure mesa. In certain embodiments, the n-contact interconnect laterally surrounds a perimeter of the p-contact interconnect within the passivation layer.

In another aspect, an LED chip comprises: an active structure comprising an n-type layer, a p-type layer, and an active layer arranged between the n-type layer and the p-type layer, wherein the p-type layer, the active layer, and a portion of the n-type layer form an active LED structure mesa; an n-contact and a p-contact on the active LED structure mesa; an n-contact interconnect electrically connected between the n-contact and the n-type layer; and a p-contact interconnect electrically connected between the p-contact and the p-type layer, wherein the n-contact interconnect is configured to laterally surround a perimeter of the p-contact interconnect across the active LED structure mesa. In certain embodiments, the n-contact interconnect is electrically connected to the n-type layer outside a lateral boundary of the active LED structure mesa. In certain embodiments, the p-contact interconnect is electrically connected to the p-type layer within a lateral boundary of the active LED structure mesa. In certain embodiments, a passivation layer is configured between at least a portion of the n-contact interconnect and the n-contact, and the passivation layer is further configured between at least a portion of the p-contact interconnect and the p-contact. The LED chip may further comprise a reflective structure on the p-type layer, wherein the reflective structure comprises a dielectric reflective layer and a metal reflective layer. The metal reflective layer may form a plurality of reflective layer interconnects that extend through an entire thickness of the dielectric reflective layer.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
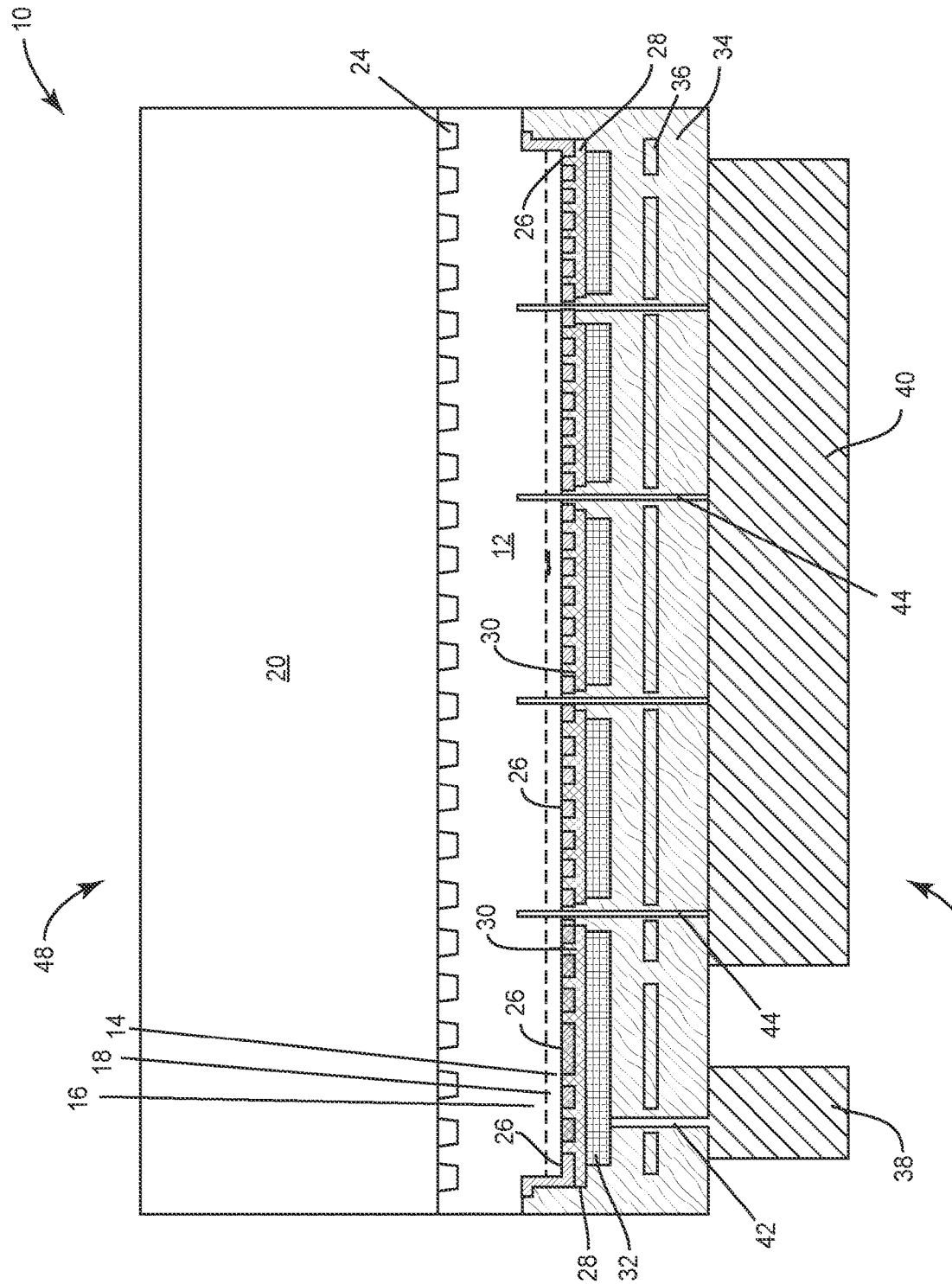
FIG. 1 is a cross-sectional view of a representative light-emitting diode (LED) chip arranged in a flip-chip configuration.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to solid-state lighting devices including light-emitting diodes (LEDs) and more particularly to contact structures for LED chips. LED chips as disclosed herein may include contact structure arrangements that have reduced impact on areas of active LED structures within the LED chips. Active LED structures typically include an active layer that is arranged between an n-type layer and a p-type layer. In certain embodiments, contact structures include an n-contact and electrical connections between the n-contact and the n-type layer that are arranged outside of a perimeter edge or a perimeter corner of the active LED structure. In certain embodiments, n-contact interconnect configurations are disclosed that form electrical connections between n-contacts and n-type layers of LED chips outside of lateral boundaries of the active LED structures. By electrically contacting n-type layers outside of the lateral boundaries of the active LED structures, LED chips are provided with improved current spreading and improved brightness. In certain embodiments, n-contact interconnects may be configured to extend across or cover areas of the active LED structure. In certain embodiments, contact structures may include p-contact interconnect configurations that form electrical connections between p-contacts and p-type layers of LED chips. The p-contact interconnects may extend across or cover different areas of the active LED structure than the n-contact interconnects.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

An LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{i-x-y}Sr_xEu_yAlSiN_3$) and combinations thereof. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflective layer and a dielectric reflective layer, wherein the dielectric reflective layer is arranged between the metal reflective layer and a plurality of semiconductor layers. A passivation layer is arranged between the metal reflective layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In some embodiments, the flip-chip LED chip may be configured as described in commonly-assigned U.S. Publication No. 2017/0098746, which is hereby incorporated by reference herein. In some embodiments, an LED package may be configured as set forth in the following commonly-assigned U.S. patents and U.S. publications, which are hereby incorporated by reference herein: U.S. Pat. Nos. 8,866,169; 9,070,850; 9,887,327; and U.S. Publication No. 2015/0179903.

FIG. 1 is a cross-sectional view of a representative LED chip 10 arranged in a flip-chip configuration, although other configurations are possible. The LED chip 10 includes an active LED structure 12 comprising a p-type layer 14, an n-type layer 16, and an active layer 18 formed on a substrate 20. In some embodiments, the n-type layer 16 is between the active layer 18 and the substrate 20. In other embodiments, the doping order may be reversed such that a layer 16 is doped p-type and a layer 14 is doped n-type. The substrate 20 can comprise many different materials such as SiC or sapphire and can have one or more surfaces that are shaped, textured, or patterned to enhance light extraction. In certain embodiments, the substrate 20 is light transmissive (preferably transparent) and may include a patterned surface 24 that is proximate the active LED structure 12 and includes multiple recessed and/or raised features. In some embodiments, the patterned surface 24 is adjacent the n-type layer 16 of the active LED structure 12. The patterned surface 24 is particularly useful in embodiments in which the substrate 20 comprises sapphire in order to promote extraction of light through an interface between the active LED structure 12 and the substrate 20.

In FIG. 1, a first reflective layer 26 is provided on the p-type layer 14. In certain embodiments, a current spreading layer (not shown) may be provided between the p-type layer 14 and the first reflective layer 26. The current spreading layer may include a thin layer of a transparent conductive oxide such indium tin oxide (ITO) or a metal such as platinum (Pt), although other materials may be used. The first reflective layer 26 can comprise many different materials and preferably comprises a material that presents an index of refraction step with the material comprising the active LED structure 12 to promote total internal reflection (TIR) of light generated from the active LED structure 12. Light that experiences TIR is redirected without experiencing absorption or loss, and can thereby contribute to useful or desired LED chip emission. In some embodiments, the first reflective layer 26 comprises a material with an index of refraction lower than the index of refraction of the active LED structure 12 material. The first reflective layer 26 may comprise many different materials, with some having an index of refraction less than 2.3, while others can have an index of refraction less than 2.15, less than 2.0, and less than 1.5. In some embodiments the first reflective layer 26 comprises a dielectric material, with some embodiments comprising silicon dioxide ($SiO_2$) and/or silicon nitride (SiN). It is understood that many dielectric materials can be used such as SiN, SiNx, $Si_3N_4$, Si, germanium (Ge), $SiO_2$, SiOx, titanium dioxide ($TiO_2$), tantalum pentoxide ($Ta_2O_5$), ITO, magnesium oxide (MgOx), zinc oxide (ZnO), and combinations thereof. In certain embodiments, the first reflective layer 26 may include multiple alternating layers of different dielectric materials, e.g. alternating layers of $SiO_2$ and SiN that symmetrically repeat or are asymmetrically arranged. Some Group III nitride materials such as GaN can have an index of refraction of approximately 2.4, and $SiO_2$ can have an index of refraction of approximately 1.48, and SiN can have an index of refraction of approximately 1.9.

Embodiments with the active LED structure 12 comprising GaN and the first reflective layer 26 comprising SiO$_2$ can have a sufficient index of refraction step between the two to allow for efficient TIR of light. The first reflective layer 26 can have different thicknesses depending on the type of materials used, with some embodiments having a thickness of at least 0.2 microns (μm). In some of these embodiments, the first reflective layer 26 can have a thickness in the range of 0.2 μm to 0.7 μm, while in some of these embodiments it can be approximately 0.5 μm thick.

In FIG. 1, the LED chip 10 may further include a second reflective layer 28 that is on the first reflective layer 26 such that the first reflective layer 26 is arranged between the active LED structure 12 and the second reflective layer 28. The second reflective layer 28 may include a metal layer that is configured to reflect any light from the active LED structure 12 that may pass through the first reflective layer 26. The second reflective layer 28 can comprise many different materials such as Ag, gold (Au), Al, or combinations thereof. As illustrated, the second reflective layer 28 may include one or more reflective layer interconnects 30 that provide an electrically conductive path through the first reflective layer 26. In certain embodiments, the reflective layer interconnects 30 comprise reflective layer vias. Accordingly, the first reflective layer 26, the second reflective layer 28, and the reflective layer interconnects 30 form a reflective structure of the LED chip 10. In some embodiments, the reflective layer interconnects 30 comprise the same material as the second reflective layer 28 and are formed at the same time as the second reflective layer 28. In other embodiments, the reflective layer interconnects 30 may comprise a different material than the second reflective layer 28. Some embodiments may also comprise an adhesion layer that is positioned between the first reflective layer 26 and the second reflective layer 28 to promote adhesion between the two. Many different materials can be used for the adhesion layer, such as titanium oxide (TiO, TiO$_2$), titanium oxynitride (TiON, Ti$_x$O$_y$N) tantalum oxide (TaO, Ta$_2$O$_5$), tantalum oxynitride (TaON), aluminum oxide (AlO, Al$_x$O$_y$) or combinations thereof, with a preferred material being TiON, AlO, or Al$_x$O$_y$. In certain embodiments, the adhesion layer comprises Al$_x$O$_y$, where 1≤x≤4 and 1≤y≤6. In certain embodiments, the adhesion layer comprises Al$_x$O$_y$, where x=2 and y=3, or Al$_2$O$_3$. The adhesion layer may be deposited by electron beam deposition that may provide a smooth, dense, and continuous layer without notable variations in surface morphology. The adhesion layer may also be deposited by sputtering, chemical vapor deposition, or plasma enhanced chemical vapor deposition.

The LED chip 10 may also comprise a barrier layer 32 on the second reflective layer 28 to prevent migration of the second reflective layer 28 material, such as Ag, to other layers. Preventing this migration helps the LED chip 10 maintain efficient operation through its lifetime. The barrier layer 32 may comprise an electrically conductive material, with suitable materials including but not limited to sputtered Ti/Pt followed by evaporated Au bulk material or sputtered Ti/Ni followed by an evaporated Ti/Au bulk material. A passivation layer 34 is included on the barrier layer 32 as well as any portions of the second reflective layer 28 that may be uncovered by the barrier layer 32. The passivation layer 34 protects and provides electrical insulation for the LED chip 10 and can comprise many different materials, such as a dielectric material. In some embodiments, the passivation layer 34 is a single layer, and in other embodiments, the passivation layer 34 comprises a plurality of layers. A suitable material for the passivation layer 34 includes, but is not limited to, silicon nitride. In some embodiments, the passivation layer 34 includes a metal-containing interlayer 36 arranged therein, wherein the interlayer 36 may comprise Al or another suitable metal. Notably, the interlayer 36 is embedded within the passivation layer 34 and is electrically isolated from the rest of the LED chip 10. In application, the interlayer 36 may function as a crack stop layer for any cracks that may propagate through the passivation layer 34. Additionally, the interlayer 36 may reflect at least some light that may pass through both the first reflective layer 26 and the second reflective layer 28.

In FIG. 1, the LED chip 10 comprises a p-contact 38 and an n-contact 40 that are arranged on the passivation layer 34 and are configured to provide electrical connections with the active LED structure 12. The p-contact 38, which may also be referred to as an anode contact, may comprise one or more p-contact interconnects 42 that extend through the passivation layer 34 to the barrier layer 32 or the second reflective layer 28 to provide an electrical path to the p-type layer 14. In certain embodiments, the one or more p-contact interconnects 42 comprise one or more p-contact vias. The n-contact 40, which may also be referred to as a cathode contact, may comprise one or more n-contact interconnects 44 that extend through the passivation layer 34, the barrier layer 32, the first and second reflective layers 26, 28, the p-type layer 14, and the active layer 18 to provide an electrical path to the n-type layer 16. In certain embodiments, the one or more n-contact interconnects 44 comprise one or more n-contact vias. In operation, a signal applied across the p-contact 38 and the n-contact 40 is conducted to the p-type layer 14 and the n-type layer 16, causing the LED chip 10 to emit light from the active layer 18. The p-contact 38 and the n-contact 40 can comprise many different materials such as Au, copper (Cu), nickel (Ni), In, Al, Ag, tin (Sn), Pt, or combinations thereof. In still other embodiments, the p-contact 38 and the n-contact 40 can comprise conducting oxides and transparent conducting oxides such as ITO, nickel oxide (NiO), ZnO, cadmium tin oxide, indium oxide, tin oxide, magnesium oxide, ZnGa$_2$O$_4$, ZnO$_2$/Sb, Ga$_2$O$_3$/Sn, AgInO$_2$/Sn, In$_2$O$_3$/Zn, CuAlO$_2$, LaCuOS, CuGaO$_2$, and SrCu$_2$O$_2$. The choice of material used can depend on the location of the contacts 38, 40 and on the desired electrical characteristics, such as transparency, junction resistivity, and sheet resistance. As described above, the LED chip 10 is arranged for flip-chip mounting and the p-contact 38 and n-contact 40 are configured to be mounted or bonded to a surface, such as a printed circuit board. Accordingly, the p-contact 38 and the n-contact 40 may be referred to as die-attach metals or bond metals. In this regard, the LED chip 10 includes a mounting face 46 that is configured to be mounted to a surface, and a primary light-emitting face 48 that is opposite the mounting face 46. In certain embodiments, the primary light-emitting face 48 comprises the substrate 20, and light emitted from the active layer 18 primarily exits the LED chip 10 through the substrate 20. In other embodiments, the substrate 20 may be removed or replaced.

Figure 2:
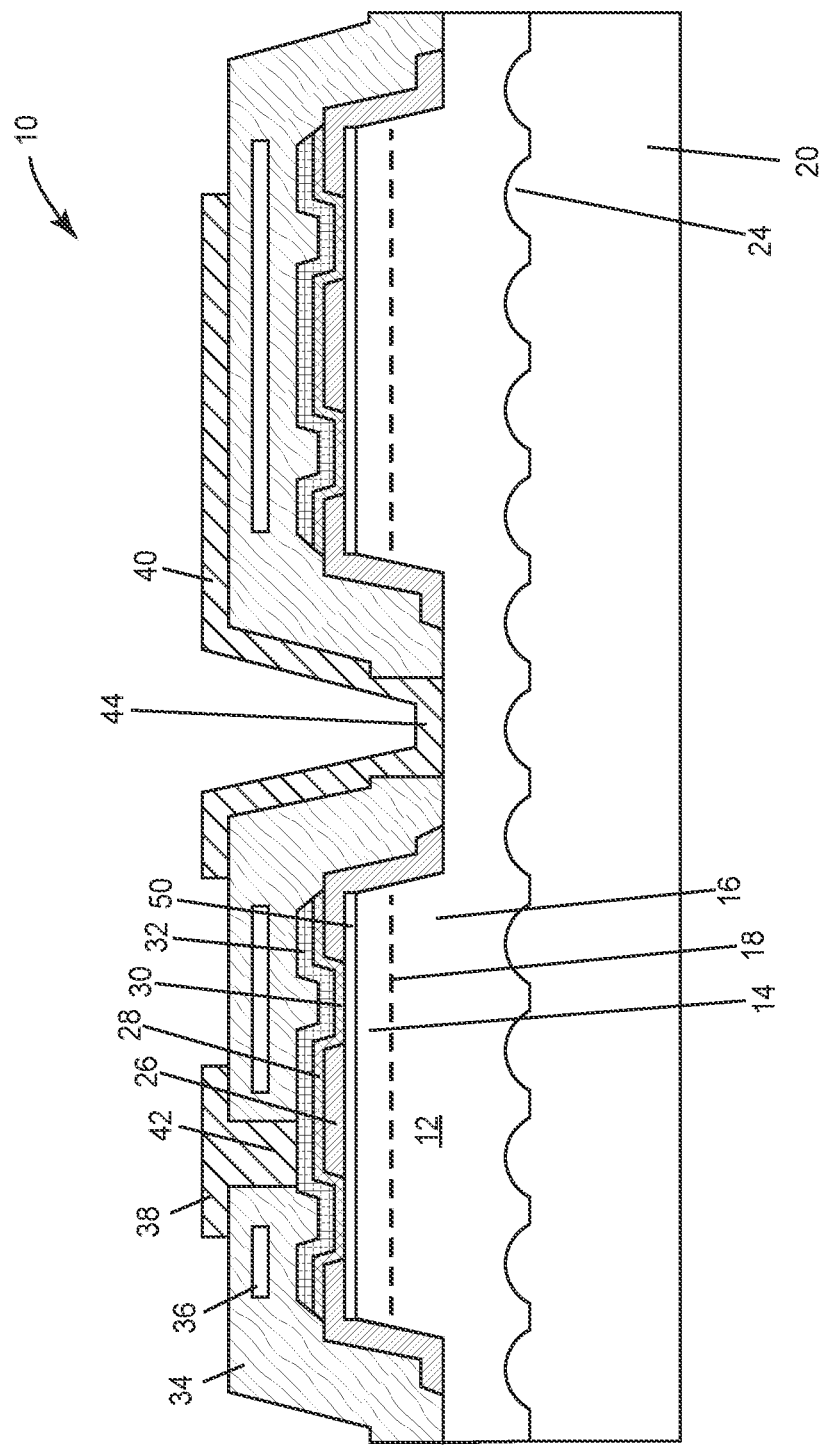
FIG. 2 is cross-sectional view of a portion of the LED chip of FIG. 1 before flip-chip mounting.

FIG. 2 is cross-sectional view of a portion of the LED chip 10 of FIG. 1 before flip-chip mounting and includes the active LED structure 12, the p-type layer 14, the n-type layer 16, the active layer 18, the substrate 20, the patterned surface 24, the first reflective layer 26, the second reflective layer 28, the one or more reflective layer interconnects 30, the barrier layer 32, the passivation layer 34, and the interlayer 36 as previously described. A current spreading layer 50 as previously described is visible in FIG. 2. In certain embodiments, the current spreading layer 50 is not present. As shown, the p-contact 38, the p-contact interconnect 42, the n-contact 40, and the n-contact interconnect 44 extend through the passivation layer 34. Notably, the n-contact interconnect 44 extends through a larger opening in the passivation layer 34 than an opening in the passivation layer 34 through which the p-contact interconnect 42 extends. The n-contact interconnect 44 additionally extends through an opening in the active LED structure 12 including the p-type layer 14, the active layer 18, and a portion of the n-type layer 16. In this regard, the n-contact interconnect 44 is relatively larger than the p-contact interconnect 42 and the reflective layer interconnects 30. In certain embodiments, a portion of the first reflective layer 26 may be arranged along a sidewall of the opening in the active LED structure 12 where the n-contact interconnect 44 is formed. In this regard, at least some light generated from the active LED structure 12 that travels in a direction toward the n-contact interconnect 44 may be redirected without being lost to absorption in the n-contact interconnect 44. Additionally, a portion of the first reflective layer 26 may also be arranged to laterally or peripherally bound the p-type layer 14, the active layer 18, and portions of the n-type layer 16 around a perimeter of the LED chip 10 to redirect light that may otherwise laterally escape along outside edges of the LED chip 10. As illustrated, the n-contact interconnect 44 provides an electrical connection between the n-contact 40 and the n-type layer 16 of the active LED structure 12 within lateral boundaries of the active LED structure 12. In this regard, the active LED structure 12 is continuous around the n-contact interconnect 44. By arranging the n-contact interconnect 44 in such a manner, current may be evenly distributed within the active LED structure 12 during operation. Additionally, when the LED chip 10 is flip-chip mounted, the n-contact 40, the n-contact interconnect 44, the p-contact 38, and the p-contact interconnect 42 are arranged between the substrate 20 and a surface on which the LED chip 10 is mounted. In this regard, the n-contact 40, the n-contact interconnect 44, the p-contact 38, and the p-contact interconnect 42 are arranged away from a primary emission direction that is through the substrate 20. A trade-off exists for arranging the n-contact interconnect 44 within the LED chip 10 in this configuration. In particular, when the n-contact interconnect 44 is arranged within lateral boundaries of the active LED structure 12, a portion of the active LED structure 12 including a portion of the active layer 18 and the p-type layer 14 are removed. Accordingly, light is not generated in the opening registered with the n-contact interconnect 44 and the overall brightness of the LED chip 10 may be reduced due to the reduction of area for the active LED structure 12. Additionally, a portion of light that is generated by the active LED structure 12 that surrounds the n-contact interconnect 44 may be lost to absorption by the n-contact interconnect 44.

According to embodiments disclosed herein, an LED chip is configured with an n-contact electrically connected to an n-type layer outside of lateral boundaries of the active LED structure. In particular, electrical connections between the n-contact and the n-type layer are arranged outside of a perimeter edge or a perimeter corner of the active LED structure. In this manner, the area of the active LED structure may not be reduced within the lateral boundaries of the active LED structure and the amount of light absorbing material within the lateral boundaries of the active LED structure is reduced, thereby improving light output for the LED chip. In certain embodiments, the n-contact is electrically connected to the n-type layer outside a lateral boundary of the active LED structure and a portion of the n-contact is arranged to extend along the LED chip such that a portion of a p-type layer is arranged between the n-contact and the n-type layer. In this manner, FIGS. 3A-10B illustrate various top views and corresponding cross-sectional views of a representative LED chip in various states of fabrication. For simplicity, FIGS. 3A-10B illustrate various states of fabrication for a single LED chip, however it is understood that multiple LED chips may be fabricated at the same time on a wafer level before singulation in a manner similar to what is shown in FIGS. 3A-10B.

Figure 3A:
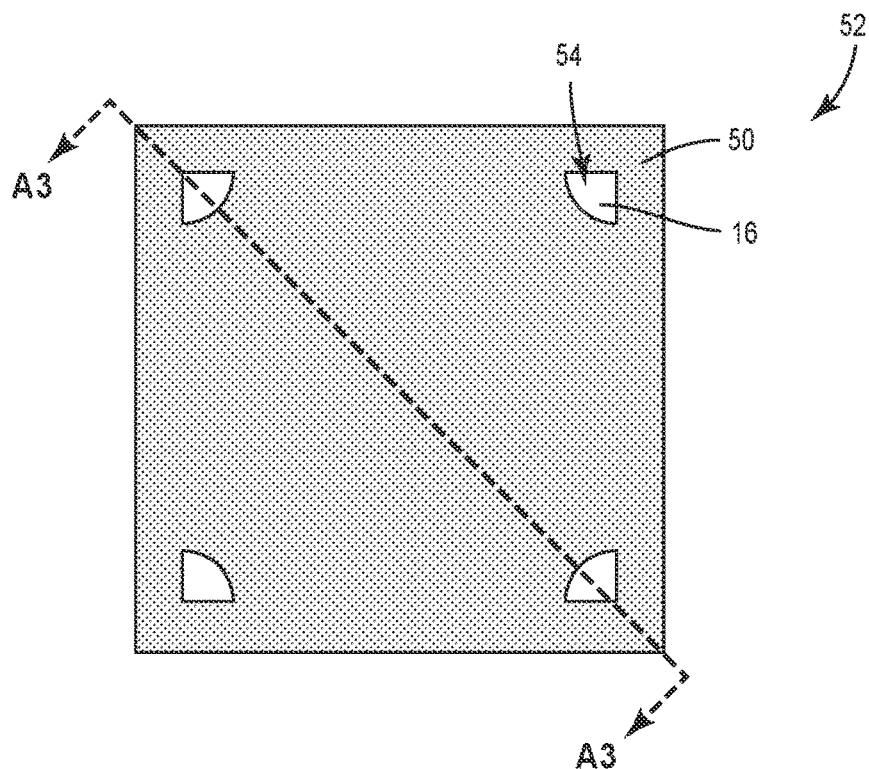
FIG. 3A is a top view representation at a particular state of fabrication for an LED chip according to embodiments disclosed herein.
Figure 3B:
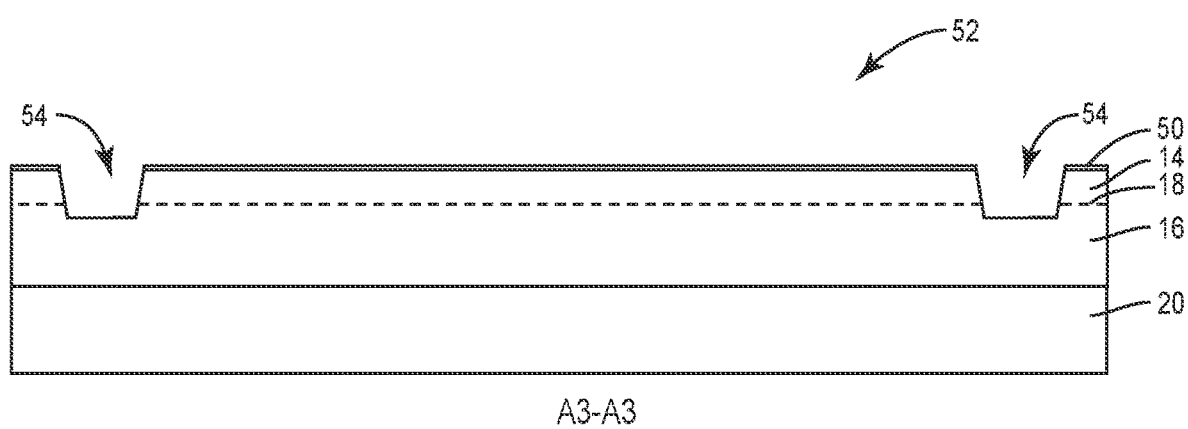
FIG. 3B is a cross-sectional view taken along the sectional line A3-A3 of FIG. 3A.

FIG. 3A is a top view representation at a particular state of fabrication for an LED chip 52 according to embodiments disclosed herein. FIG. 3B is a cross-sectional view taken along the sectional line A3-A3 of FIG. 3A. As illustrated, the n-type layer 16, the active layer 18, the p-type layer 14, and the current spreading layer 50 are sequentially arranged on the substrate 20 as previously described. In FIG. 3A and FIG. 3B, portions of the current spreading layer 50, the p-type layer 14, and the active layer 18 are removed to form one or more active LED structure openings 54. As illustrated, the active LED structure openings 54 extend either to a surface of the n-type layer 16 or into a portion of the n-type layer 16. As will be described later in more detail, the active LED structure openings 54 are locations where the n-contact interconnect (44 of FIG. 2) will be arranged to make an electrical connection with the n-type layer 16. In certain embodiments, the active LED structure openings 54 are formed by an etching step through a patterned mask, including chlorine-based etching, inductively coupled plasma etching, or reactive ion etching.

Figure 4A:
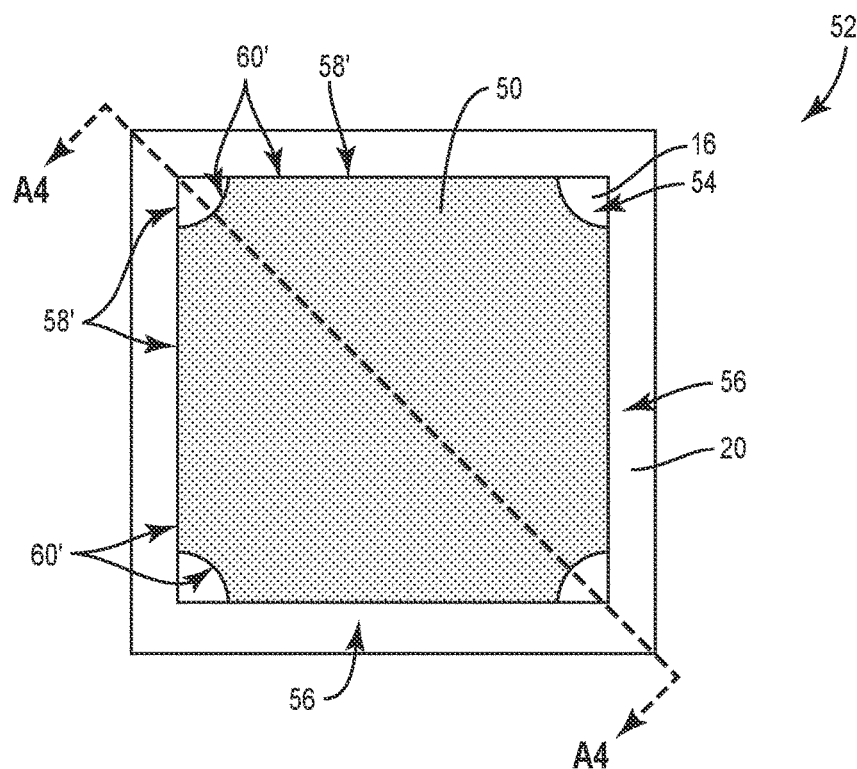
FIG. 4A is a top view representation at a subsequent state of fabrication for the LED chip of FIG. 3A wherein streets are formed along a perimeter of the substrate.
Figure 4B:
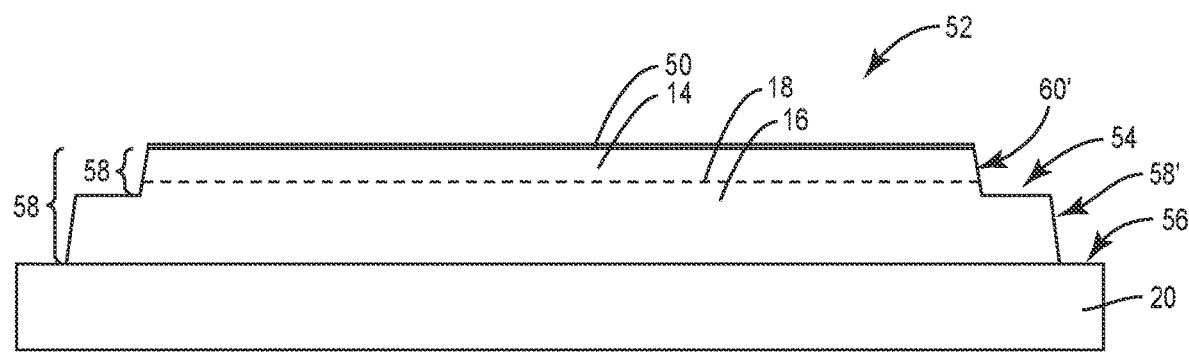
FIG. 4B is a cross-sectional view taken along the sectional line A4-A4 of FIG. 4A.

FIG. 4A is a top view representation at a subsequent state of fabrication for the LED chip 52 of FIG. 3A wherein streets 56 are formed along a perimeter of the substrate 20. FIG. 4B is a cross-sectional view taken along the sectional line A4-A4 of FIG. 4A. In certain embodiments, the streets 56 are formed by another etching step that is similar to the previous etching step, e.g. etching through a mask. For wafer-level processing, the streets 56 are isolation lines that define distinct regions across the substrate 20 and each distinct region includes a separate portion of the n-type layer 16, the active layer 18, the p-type layer 14, and the current spreading layer 50. In particular, the streets 56 are regions where individual LED chips 52 will be separated or singulated after wafer-level fabrication steps are complete. In certain embodiments, the streets 56 are formed to expose portions of the substrate 20 along a perimeter of the LED chip 52, thereby forming an epitaxial mesa 58 that includes the n-type layer 16, the active layer 18, and the p-type layer 14. As illustrated in FIG. 4A, lateral boundaries 58' of the epitaxial mesa 58 form a first shape that is a square, although other shapes are possible. Additionally, an active LED structure mesa 60 is also formed. The active LED structure mesa 60 includes the p-type layer 14, the active layer 18, and a portion of the n-type layer 16. Lateral boundaries 60' of the active LED structure mesa 60 form a second shape that is different than the first shape. In particular, the active LED structure mesa 60 comprises a square shape with inwardly curved or scooped corners. The scooped corners correspond to the active LED structure openings 54 that were previously defined in FIGS. 3A and 3B. In this regard, the active LED structure mesa 60 may be self-aligned with portions of the epitaxial mesa 58 that are not registered with the active LED structure openings 54. For example, lateral edges of the epitaxial mesa 58 are aligned with lateral edges of the active LED structure mesa 60, while corners of the epitaxial mesa 58 are not aligned with the scooped corners of the active LED structure mesa 60. In this regard, portions of the n-type layer 16 are exposed or uncovered by the active LED structure openings 54 are outside of lateral boundaries 60' of the active LED structure mesa 60.

Figure 5A:
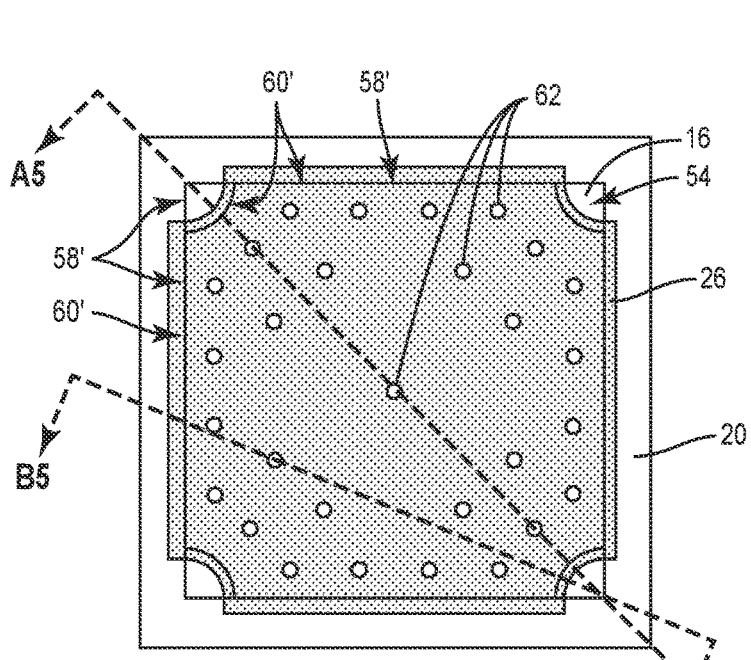
FIG. 5A is a top view representation at a subsequent state of fabrication for the LED chip of FIG. 4A after formation of a first reflective layer.
Figure 5B:
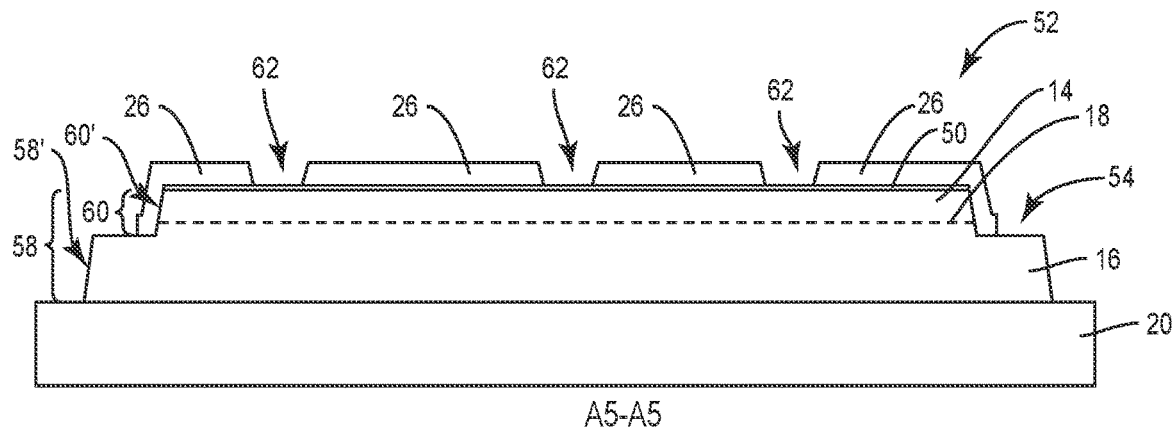
FIG. 5B is a cross-sectional view taken along the sectional line A5-A5 of FIG. 5A.
Figure 5C:
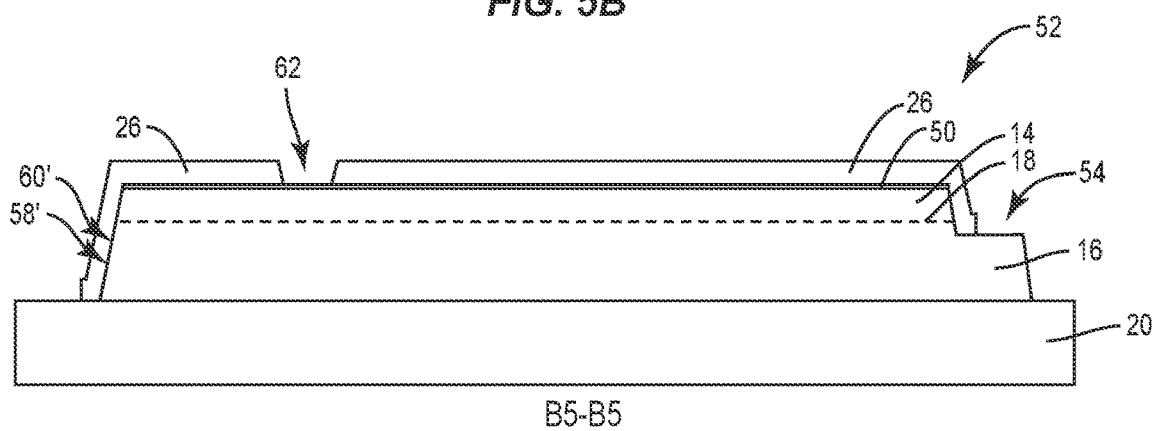
FIG. 5C is a cross-sectional view taken along the sectional line B5-B5 of FIG. 5A.

FIG. 5A is a top view representation at a subsequent state of fabrication for the LED chip 52 of FIG. 4A after formation of the first reflective layer 26. FIG. 5B is a cross-sectional view taken along the sectional line A5-A5 of FIG. 5A. FIG. 5C is a cross-sectional view taken along the sectional line B5-B5 of FIG. 5A. The first reflective layer 26, such as a dielectric reflective layer as previously described, is deposited or otherwise formed over the current spreading layer 50, the p-type layer 14, the active layer 18, and the n-type layer 16. Portions of the first reflective layer 26 may be removed by another etching step through a patterned mask to form a plurality of first reflective layer openings 62. In other embodiments, the reflective layer openings 62 may be formed at the same time as the first reflective layer 26 by selective deposition through a mask. Notably, the first reflective layer 26 is configured to extend along and overhang the lateral boundaries 60' of the active LED structure mesa 60 such that the first reflective layer 26 is also arranged on lateral sidewalls of the p-type layer 14, the active layer 18, and the portions of the n-type layer 16 that form the active LED structure mesa 60. Accordingly, the first reflective layer 26 laterally bounds the active LED structure mesa 60 in certain embodiments. In this regard, light generated by the active layer 18 that may impinge the lateral sidewalls of the p-type layer 14, the active layer 18, and the portions of the n-type layer 16 may be redirected toward a desired emission direction. As illustrated, the first reflective layer 26 does not cover all lateral sidewalls of the epitaxial mesa 58. In particular, at least some portions of the n-type layer 16 that are exposed by the active LED structure openings 54 are uncovered by the first reflective layer 26 to provide surfaces for electrical connections to the n-type layer 16 in subsequent fabrication steps. As illustrated in FIG. 5C, the first reflective layer 26 may extend along and overhang the lateral boundaries 58' of the epitaxial mesa 58 that are aligned with the lateral boundaries 60' of the active LED structure mesa 60.

Figure 6A:
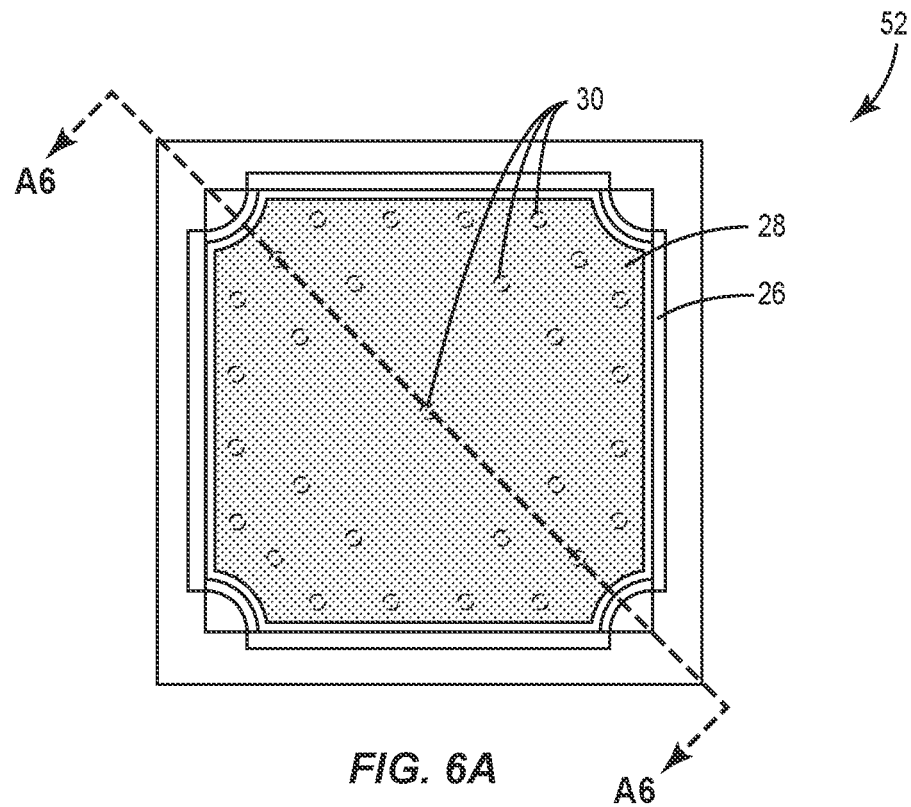
FIG. 6A is a top view representation at a subsequent state of fabrication for the LED chip of FIG. 5A after formation of a second reflective layer.
Figure 6B:
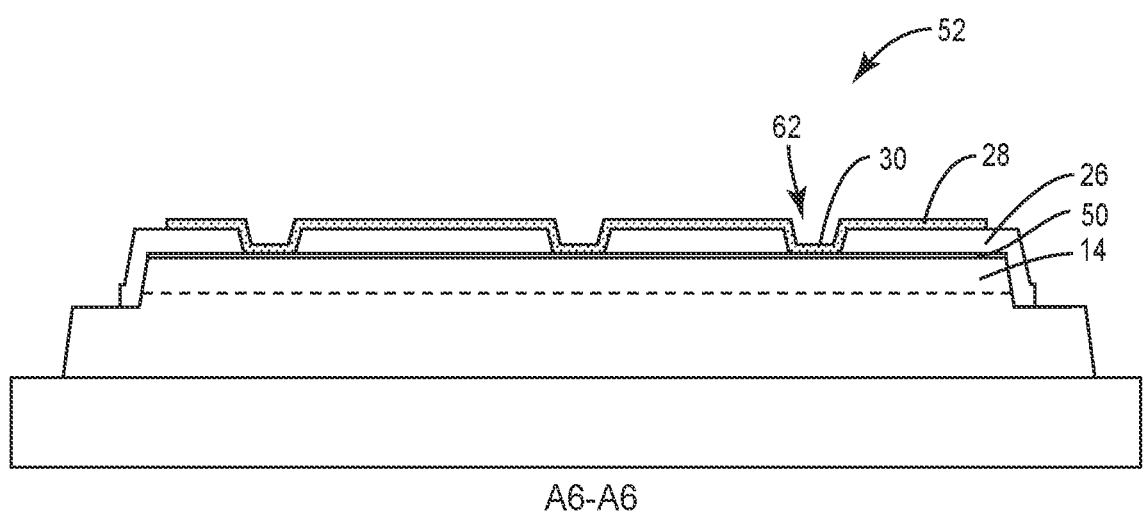
FIG. 6B is a cross-sectional view taken along the sectional line A6-A6 of FIG. 6A.

FIG. 6A is a top view representation at a subsequent state of fabrication for the LED chip 52 of FIG. 5A after formation of the second reflective layer 28. FIG. 6B is a cross-sectional view taken along the sectional line A6-A6 of FIG. 6A. The second reflective layer 28, such as a metal reflective layer as previously described, is formed over the first reflective layer 26 and fills the reflective layer openings 62 to form the one or more reflective layer interconnects 30 as previously described. The reflective layer interconnects 30 form electrically conductive paths through the first reflective layer 26 to the current spreading layer 50 and the p-type layer 14. The barrier layer (32 of FIG. 2) may also be formed over the second reflective layer 28 as previously described. As illustrated, the reflective layer interconnects 30 may be arranged across the LED chip 52 to provide multiple electrical connections with the p-type layer 14. In FIG. 6A, the reflective layer interconnects 30 are more densely arranged along perimeter portions of the LED chip 52 than in central portions of the LED chip 52. In this regard, the reflective layer interconnects 30 are configured to improve current spreading along a perimeter of the LED chip 52. Depending on the application, the reflective layer interconnects 30 may be arranged in other configurations. For example, the reflective layer interconnects 30 may be more densely arranged in central portions of the LED chip in certain embodiments. In certain embodiments, the reflective layer interconnects 30 may be symmetrically arranged or asymmetrically arranged within the LED chip 52. In certain embodiments, diameters of certain ones of the reflective layer interconnects 30 may vary based on their relative location within the LED chip 52. In this regard, the arrangement of the reflective layer interconnects 30 may be tailored to improve current spreading and provide higher lumen output and efficiency for different applications.

Figure 7A:
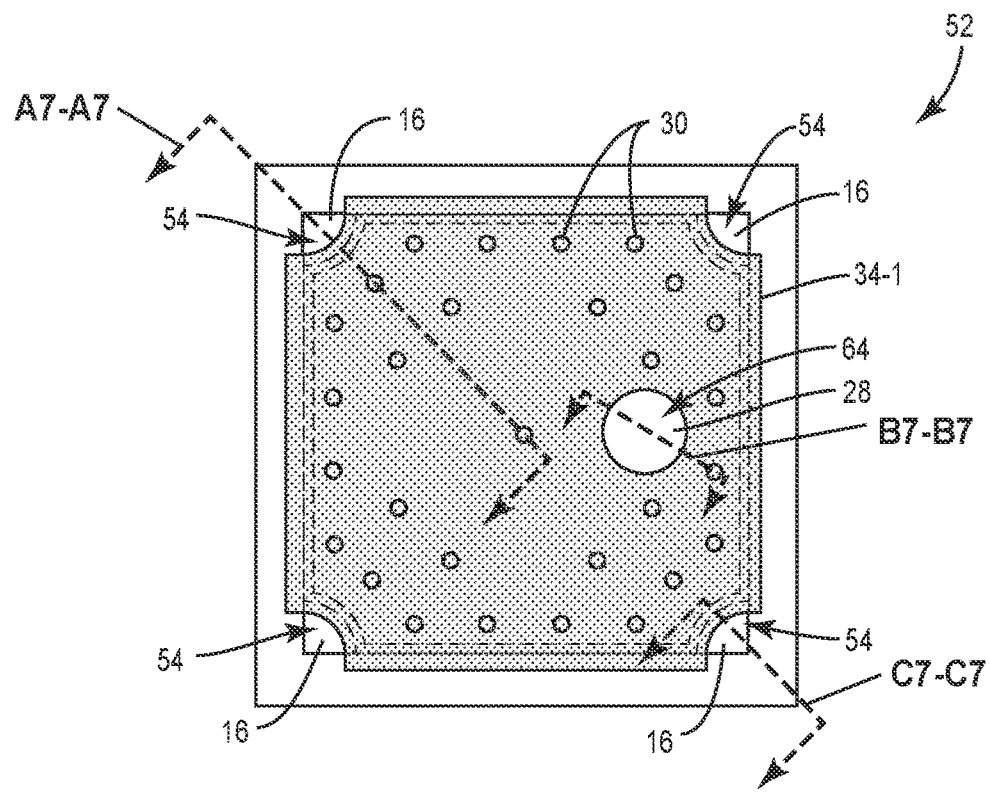
FIG. 7A is a top view representation at a subsequent state of fabrication for the LED chip of FIG. 6A after formation of a first passivation layer.
Figure 7B:
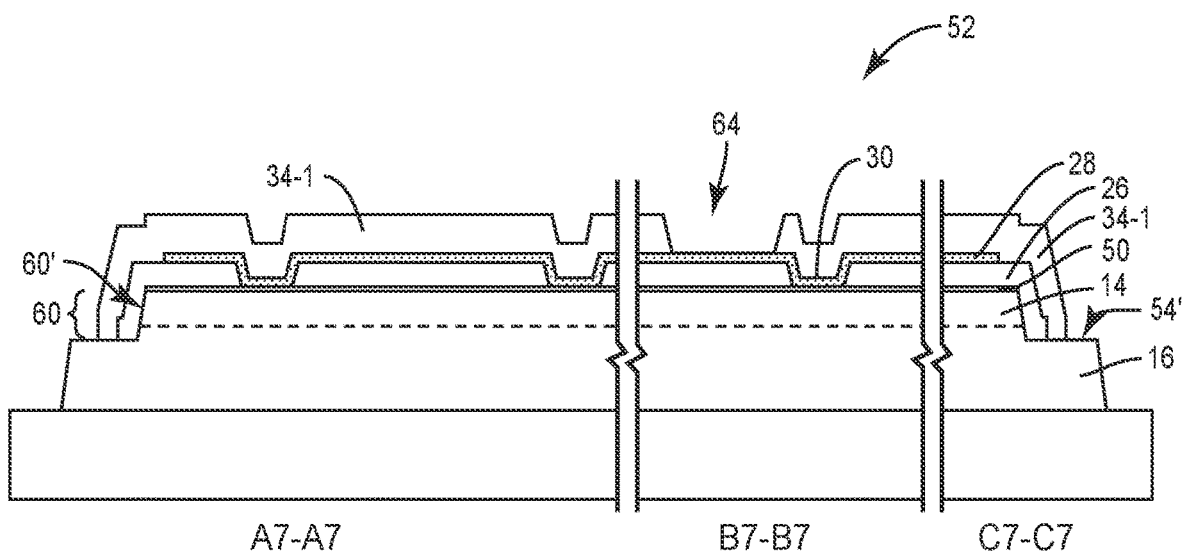
FIG. 7B is a cross-sectional view taken along the sectional lines A7-A7, B7-B7, and C7-C7 of FIG. 7A.

FIG. 7A is a top view representation at a subsequent state of fabrication for the LED chip 52 of FIG. 6A after formation of a first passivation layer 34-1. FIG. 7B is a cross-sectional view taken along the sectional lines A7-A7, B7-B7, and C7-C7 of FIG. 7A. The first passivation layer 34-1, such as silicon nitride or other dielectric materials as previously described, is deposited or otherwise formed over the second reflective layer 28, the reflective layer interconnects 30, and the first reflective layer 26. The first passivation layer 34-1 may laterally bound the first reflective layer 26 along the lateral boundaries 60' of the active LED structure mesa 60. In certain embodiments, at least some portions of the n-type layer 16 that are exposed by the active LED structure openings 54 are uncovered by the first passivation layer 34-1 to provide surfaces for electrical connections to the n-type layer 16 in subsequent fabrication steps. As illustrated in FIG. 7A, the portions of the n-type layer 16 that are exposed by the active LED structure openings 54 may form shapes that comprise at least partial circular shapes, in this case four quarter circles, that are located adjacent to each corner of the active LED structure mesa 60. In this regard, the four quarter circle shapes may collectively account for a decrease in total area of the active LED structure mesa 60 that is about the same as a single hypothetical opening in the active LED structure mesa 60 formed by a complete circular shape that combines the four quarter circles. By arranging the active LED structure openings 54 as smaller quarter circle shapes outside of lateral boundaries 60' of the active LED structure mesa 60, the LED chip 52 may have improved current spreading compared to the single hypothetical opening described above that is within the lateral boundaries 60' of the active LED structure mesa 60. Accordingly, for about the same decrease in area of the active LED structure mesa 60, the active LED structure openings 54 as illustrated in FIG. 7A provide improved brightness due to more even current spreading. In certain embodiments, the active LED structure openings 54 may form other at least partial circular shapes, including half circles, one-third circles, one-eighth circles, and so on. In order to provide a pathway to make an electrical connection with the p-type layer 14 via the current spreading layer 50, the reflective layer interconnects 30, and the second reflective layer 28, a portion of first passivation layer 34-1 is removed to form an opening 64. As illustrated, the opening 64 of the first passivation layer 34-1 exposes a portion of the second reflective layer 28 to provide the pathway for the electrical connection to the p-type layer 14 as described above.

Figure 8A:
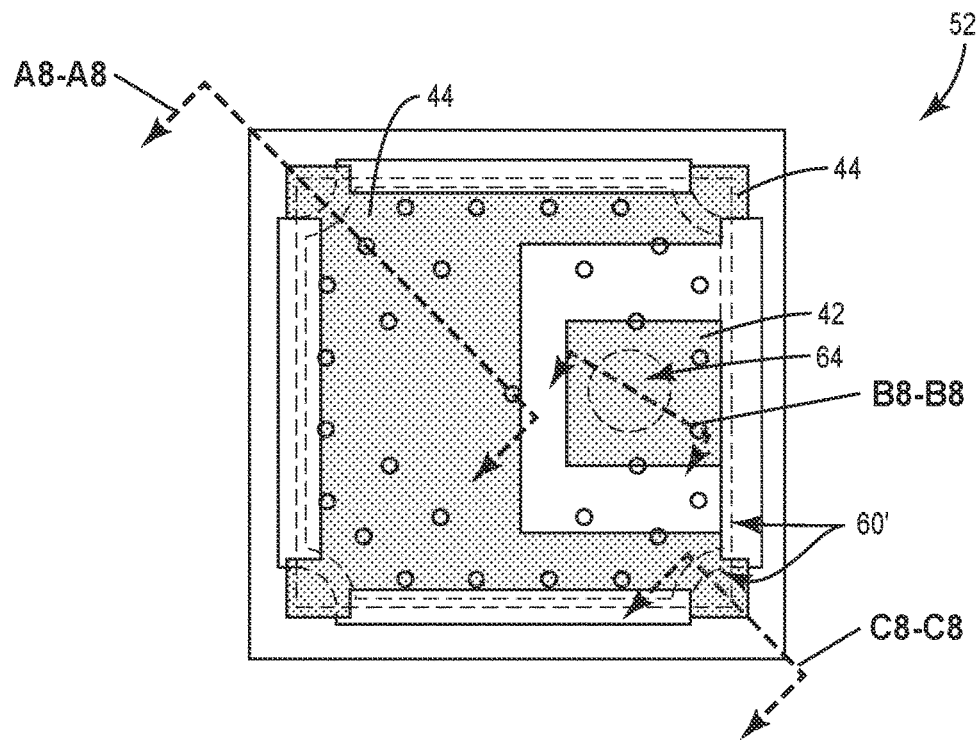
FIG. 8A is a top view representation at a subsequent state of fabrication for the LED chip of FIG. 7A after formation of an n-contact interconnect and a p-contact interconnect.
Figure 8B:
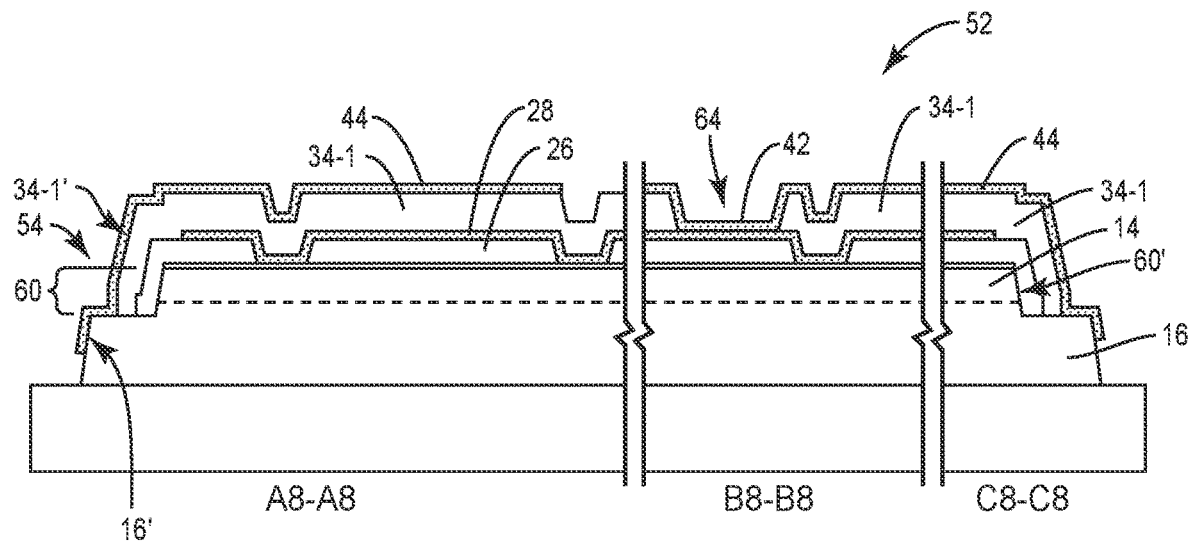
FIG. 8B is a cross-sectional view taken along the sectional lines A8-A8, B8-B8, and C8-C8 of FIG. 8A.

FIG. 8A is a top view representation at a subsequent state of fabrication for the LED chip 52 of FIG. 7A after formation of the n-contact interconnect 44 and the p-contact interconnect 42. FIG. 8B is a cross-sectional view taken along the sectional lines A8-A8, B8-B8, and C8-C8 of FIG. 8A. The n-contact interconnect 44 and the p-contact interconnect 42, each of which may include Al or other conductive metals, are deposited or otherwise formed over the first passivation layer 34-1. The n-contact interconnect 44 and the p-contact interconnect 42 may comprise the same conductive material, such as Al, or different conductive materials. In certain embodiments, the n-contact interconnect 44 and the p-contact interconnect 42 are configured to conformally coat the first passivation layer 34-1 in different areas of the LED chip 52. As illustrated, the p-contact interconnect 42 is configured to fill the opening 64 in the first passivation layer 34-1 and extend laterally along a surface of the first passivation layer 34-1. The p-contact interconnect 42 may thereby be electrically connected to the p-type layer 14 within the lateral boundaries 60' of the active LED structure mesa 60. The p-contact interconnect 42 is thereby electrically connected to the p-type layer 14 via the second reflective layer 28, the reflective layer interconnects 30, and the current spreading layer 50. The n-contact interconnect 44 extends laterally along a surface of the first passivation layer 34-1 in different areas of the LED chip 52 to prevent an electrical short between the n-contact interconnect 44 and the p-contact interconnect 42. Notably, the n-contact interconnect 44 extends along a lateral sidewall 34-1' of the first passivation layer 34-1 to make electrical connections with the portions of the n-type layer 16 that were exposed by the active LED structure openings 54. In certain embodiments, a portion of the n-contact interconnect 44 may also wrap around and electrically connect with a sidewall 16' of the n-type layer 16, thereby increasing the contact area between the n-contact interconnect 44 and the n-type layer 16 to provide a reduced forward voltage for the LED chip 52. As illustrated, the n-contact interconnect 44 is configured to electrically connect to the n-type layer 16 at multiple locations outside of the lateral boundaries 60' of the active LED structure mesa 60 of the LED chip 52. In particular, the n-contact interconnect 44 is electrically connected to the n-type layer 16 in locations that are adjacent multiple corners of the active LED structure mesa 60. As illustrated, the n-contact interconnect 44 is configured to cover a larger portion of the first passivation layer 34-1 than the p-contact interconnect 42. In particular, the n-contact interconnect 44 may be configured to laterally extend across the LED chip 52 such that an area covered by the n-contact interconnect 44 is at least greater than half the area of the active LED structure mesa 60. This may be advantageous for routing the n-contact interconnect 44 to multiple electrical connections with the n-type layer 16. As illustrated, the p-contact interconnect 42 laterally extends to cover an area that is less than half the area of the active LED structure mesa 60. In other embodiments, the p-contact interconnect 42 may cover a larger portion of the first passivation layer 34-1 than the n-contact interconnect 44; however, the n-contact interconnect 44 may still be routed to provide multiple electrical connections with the n-type layer 16 with a narrower width metal pattern around a perimeter of the p-contact interconnect 42. In either configuration, the n-contact interconnect 44 and the p-contact interconnect 42 may be collectively arranged to cover a majority of the surface of the first passivation layer 34-1 to provide additional reflective surfaces for any light that may unintentionally pass through the first reflective layer 26 and the second reflective layer 28.

Figure 9A:
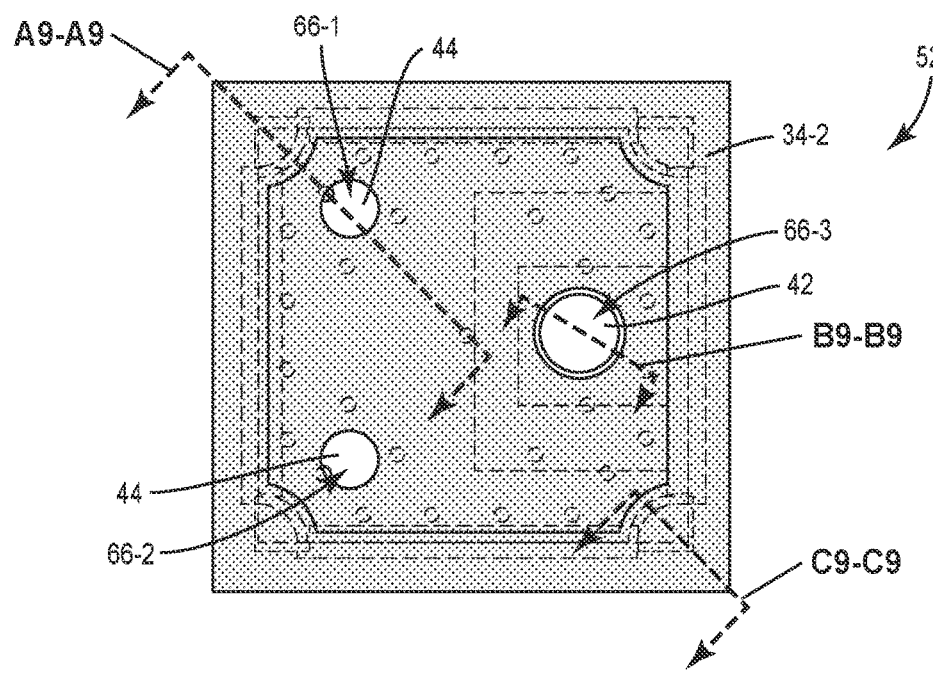
FIG. 9A is a top view representation at a subsequent state of fabrication for the LED chip of FIG. 8A after formation of a second passivation layer.
Figure 9B:
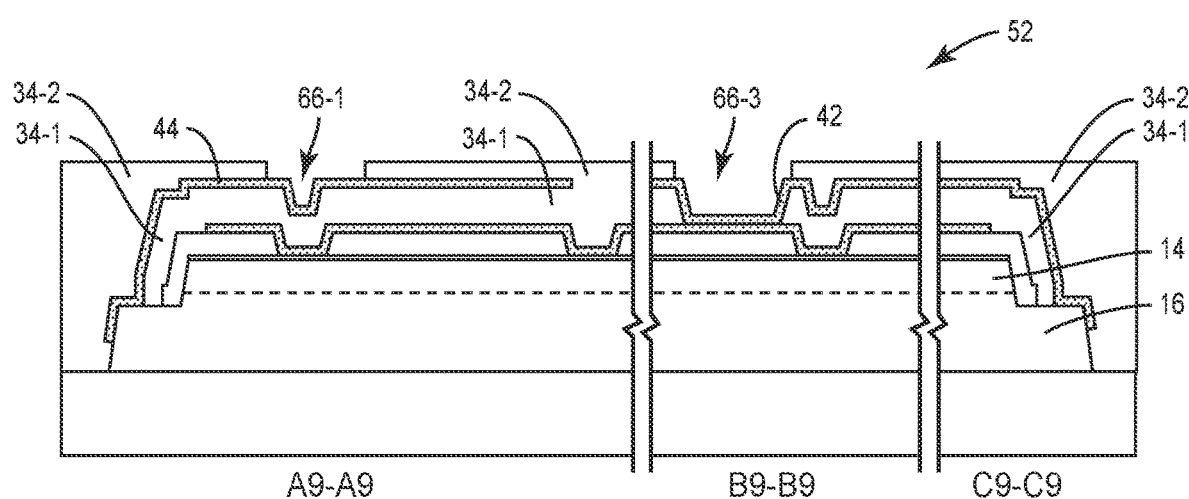
FIG. 9B is a cross-sectional view taken along the sectional lines A9-A9, B9-B9, and C9-C9 of FIG. 9A.

FIG. 9A is a top view representation at a subsequent state of fabrication for the LED chip 52 of FIG. 8A after formation of a second passivation layer 34-2. FIG. 9B is a cross-sectional view taken along the sectional lines A9-A9, B9-B9, and C9-C9 of FIG. 9A. The second passivation layer 34-2, such as silicon nitride or other dielectric materials as previously described, is deposited or otherwise formed over the n-contact interconnect 44, the p-contact interconnect 42, and the first passivation layer 34-1. In certain embodiments, the first passivation layer 34-1 and the second passivation layer 34-2 comprise the same material. In other embodiments, the first passivation layer 34-1 and the second passivation layer 34-2 may comprises different materials. In certain areas of the LED chip 52 that do not include either of the n-contact interconnect 44 or the p-contact interconnect 42, such as the end of the sectional line A9-A9 that is central to the LED chip 52, the second passivation layer 34-2 is formed on and continuous with the first passivation layer 34-1. In this regard, the first passivation layer 34-1 and the second passivation layer 34-2 may also be referred to in singular form as the passivation layer 34-1, 34-2. Accordingly, at least a portion of the n-contact interconnect 44 and at least a portion of the p-contact interconnect 42 may be embedded in the passivation layer 34-1, 34-2. As illustrated, the n-contact interconnect 44 may be configured to extend laterally in a first direction within the passivation layer 34-1, 34-2 and over the p-type layer 14 before extending in a second direction toward the n-type layer 16. In order to provide separate pathways for electrical connections with each of the n-contact interconnect 44 and the p-contact interconnect 42, portions of the second passivation layer 34-2 are removed to form a plurality of openings 66-1 to 66-3. The openings 66-1, 66-2 expose portions of the n-contact interconnect 44 to provide a pathway for electrical connection with the n-type layer 16, and the opening 66-3 exposes a portion of the p-contact interconnect 42 to provide a pathway for electrical connection with the p-type layer 14. While two openings 66-1, 66-2 are illustrated to expose portions of the n-contact interconnect 44, a single opening or three or more openings to the n-contact interconnect 44 may be provided in certain embodiments. In a similar manner, while a single opening 66-3 is illustrated to expose a portion of the p-contact interconnect 42, a plurality of openings to the p-contact interconnect 42 may be provided in certain embodiments.

Figure 10A:
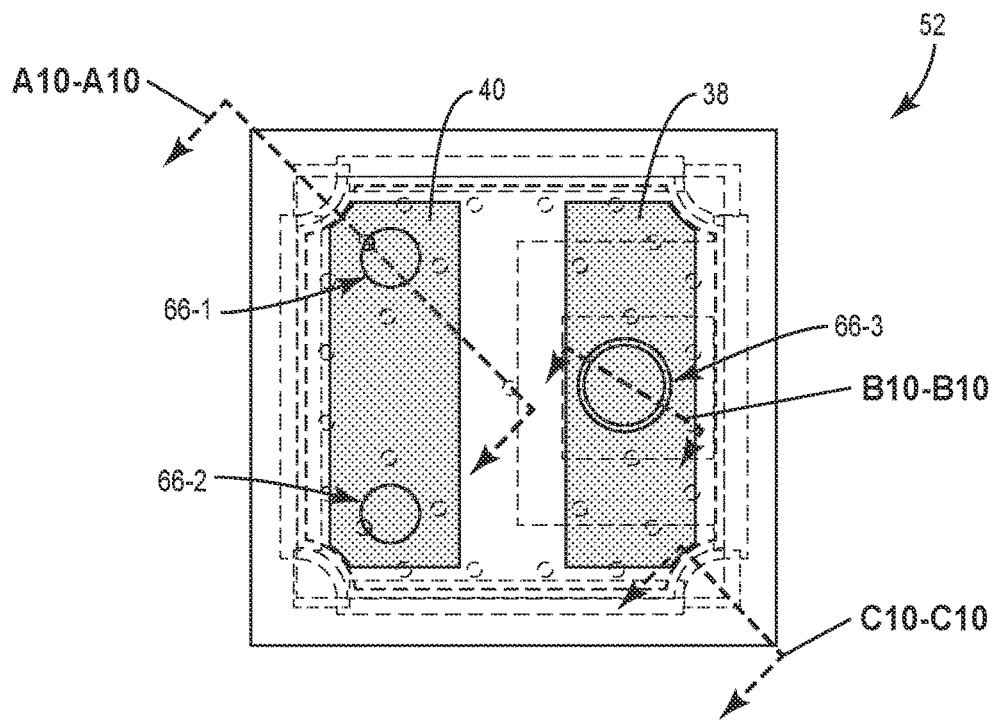
FIG. 10A is a top view representation at a subsequent state of fabrication for the LED chip of FIG. 9A after formation of a p-contact and an n-contact.
Figure 10B:
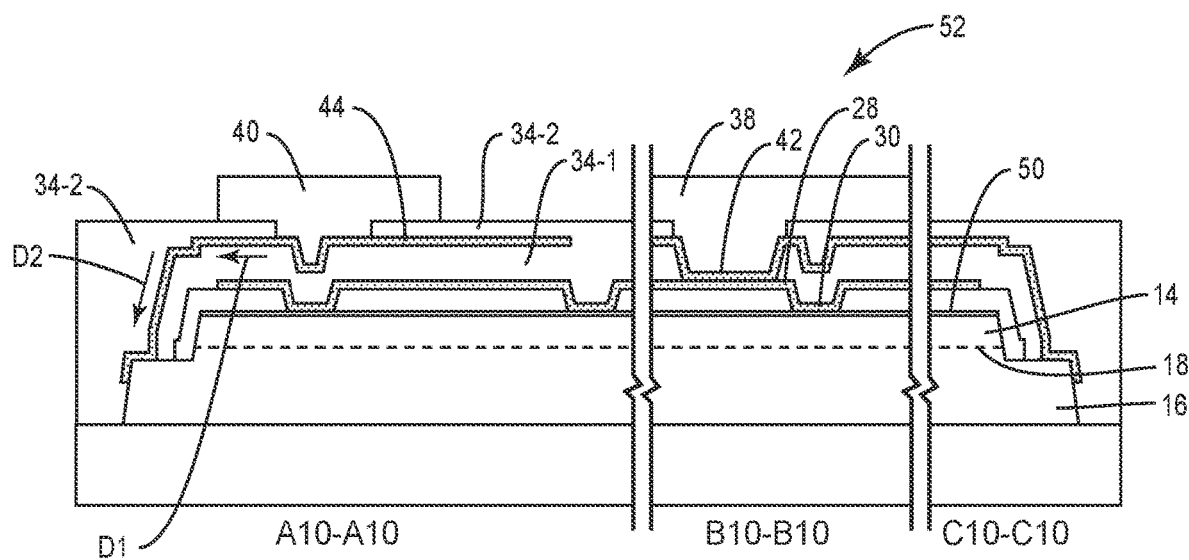
FIG. 10B is a cross-sectional view taken along the sectional lines A10-A10, B10-B10, and C10-C10 of FIG. 10A.

FIG. 10A is a top view representation at a subsequent state of fabrication for the LED chip 52 of FIG. 9A after formation of the p-contact 38 and the n-contact 40. FIG. 10B is a cross-sectional view taken along the sectional lines A10-A10, B10-610, and C10-C10 of FIG. 10A. As illustrated, the n-contact 40 is deposited or otherwise formed over the second passivation layer 34-2, and the n-contact 40 fills the openings 66-1, 66-2 to make electrical connections with the n-contact interconnect 44. In this regard, the n-contact 40 is electrically connected to the n-type layer 16 by way of the n-contact interconnect 44. In certain embodiments, the passivation layer 34-1, 34-2 is on a face of the active structure formed by the n-type layer 16, the p-type layer 14, and the active layer 18. At least a portion of the passivation layer 34-1, 34-2 is between the n-contact 40 and the active structure, and the n-contact interconnect 44 is configured to extend in a first direction D1 within the passivation layer 34-1, 34-2 and a second direction D2 within the passivation layer 34-1, 34-2 that is nonparallel with the first direction D1. As illustrated in FIG. 10B, the n-contact interconnect 44 may extend in the first direction D1 laterally within the passivation layer 34-1, 34-2, wherein the first direction D1 is between the n-contact 40 and the active structure. After extending beyond lateral boundaries of the p-type layer 14 and the active layer 18, the n-contact interconnect 44 may then extend in the second direction D2 that is nonparallel with the first direction D1, wherein the second direction is toward the n-type layer 16. In certain embodiments, the n-contact interconnect 44 may extend in three or more nonparallel directions within the passivation layer 34-1, 34-2. In a similar manner, the p-contact 38 fills the opening 66-3 to make an electrical connection with the p-contact interconnect 42. In this regard, the p-contact 38 is electrically connected to the p-type layer 14 by way of the p-contact interconnect 42, the second reflective layer 28, the reflective layer interconnects 30, and the current spreading layer 50. Additionally, the barrier layer (32 of FIG. 2) may also be formed in the electrical path between the p-contact interconnect 42 and the second reflective layer 28 as previously described. The p-contact 38 and the n-contact 40 are configured to be mounted or bonded to a surface, such as a printed circuit board, in a flip-chip configuration for the LED chip 52. In operation, a signal applied across the p-contact 38 and the n-contact 40 is conducted to the p-type layer 14 and the n-type layer 16, causing the LED chip 52 to emit light from the active layer 18.

Figure 11A:
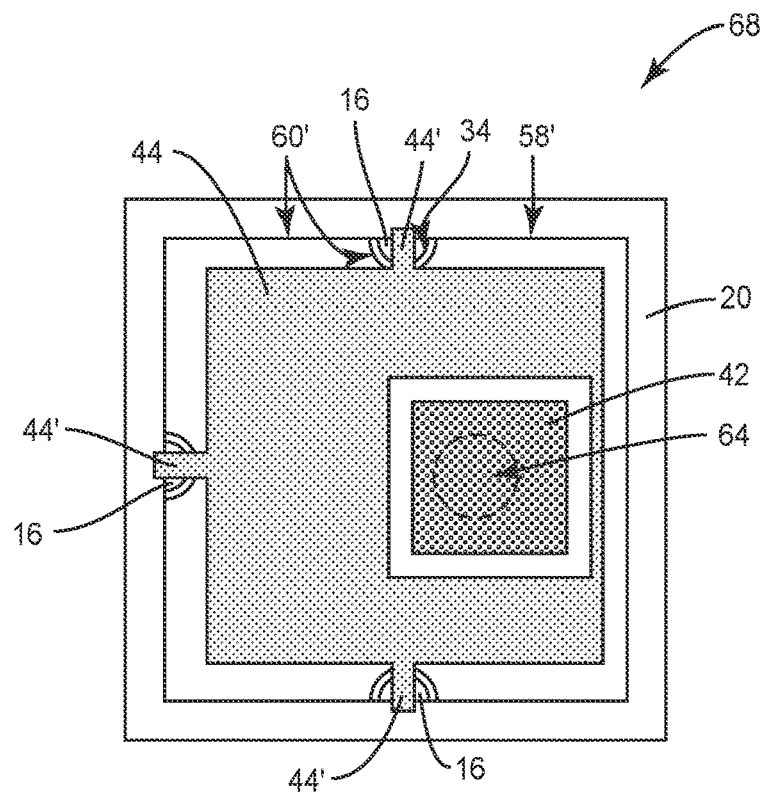
FIG. 11A illustrates a top view representation at a certain state of fabrication that is similar to FIG. 8A for an LED chip with a different configuration of the n-contact interconnect and the p-contact interconnect.
Figure 11B:
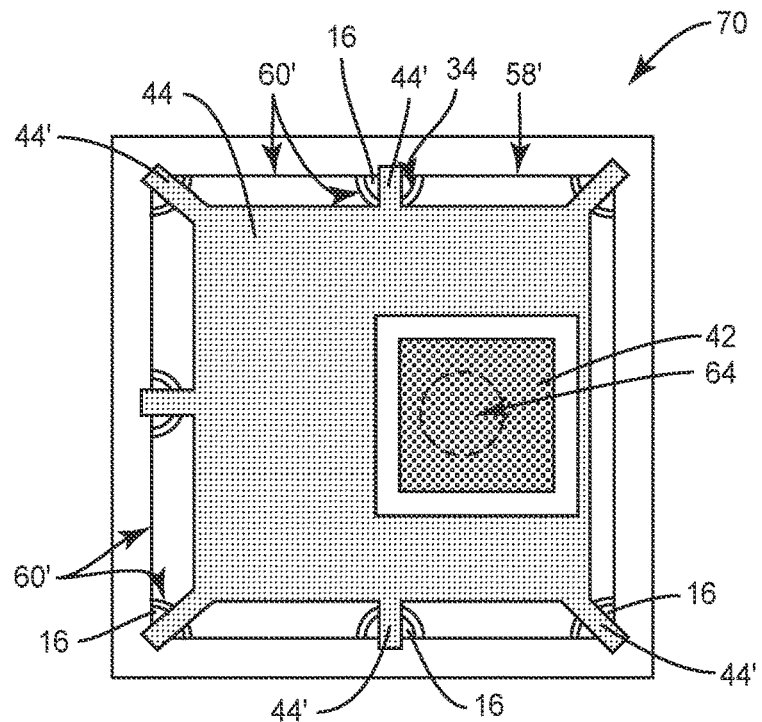
FIG. 11B illustrates a top view representation at a certain state of fabrication that is similar to FIG. 11A for an LED chip with a different configuration of the n-contact interconnect and the p-contact interconnect.

According to embodiments disclosed herein, n-contact interconnects and p-contact interconnects may be provided in various configurations. FIG. 11A illustrates a top view representation at a certain state of fabrication that is similar to FIG. 8A and FIG. 8B for an LED chip 68 with a different configuration of the n-contact interconnect 44 and the p-contact interconnect 42. For simplicity, not all of the elements shown in FIG. 8A and FIG. 8B are illustrated in FIG. 11A; however, it is understood, the LED chip 68 may include similar layer configurations as shown in FIG. 8A and FIG. 8B. The LED chip 68 includes the lateral boundaries 58' of the epitaxial mesa (58 of FIG. 4B) on the substrate 20 as previously described. The LED chip 68 further includes the lateral boundaries 60' of the active LED structure mesa (60 of FIG. 4B). As previously described, portions of the n-type layer 16 are exposed or accessible where the lateral boundaries 60' are not aligned with the lateral boundaries 58'. Notably, in FIG. 11A, portions of the n-type layer 16 are exposed or accessible adjacent to lateral edges of the active LED structure mesa (60 of FIG. 4B) defined by the lateral boundaries 60'. In this regard, the n-contact interconnect 44 and the n-contact (40 of FIG. 10B) may be electrically connected adjacent to one or more lateral edges of the active LED structure mesa (60 of FIG. 4B). In particular, when viewed from the top view of FIG. 11A, the n-contact interconnect 44 includes multiple extensions 44' that extend beyond lateral boundaries of the passivation layer 34 (e.g. 34-1 of FIG. 8B) and beyond the lateral boundaries 60' of the active LED structure mesa (60 of FIG. 4B) to provide electrical connections with the n-type layer 16. As previously described, the p-contact interconnect 42 is configured to fill the opening 64 of the passivation layer 34 as well as extend laterally along a surface of the passivation layer 34. FIG. 11B illustrates a top view representation at a certain state of fabrication that is similar to FIG. 11A for an LED chip 70 with a different configuration of the n-contact interconnect 44 and the p-contact interconnect 42. In FIG. 11B, the n-contact interconnect 44 includes multiple extensions 44' that extend beyond the lateral boundaries of the passivation layer 34 (e.g. 34-1 of FIG. 8B) and beyond the lateral boundaries 60' of the active LED structure mesa (60 of FIG. 4B) to provide electrical connections with the n-type layer 16 that is adjacent to both corners and lateral edges of the active LED structure mesa (60 of FIG. 4B). In this regard, current spreading may be further improved for the LED chip 70. Additionally, in certain embodiments, the n-contact interconnect 44 may be arranged to laterally surround a perimeter of the p-contact interconnect 42 as shown in both FIG. 11A and FIG. 11B. In particular, the n-contact interconnect 44 may be arranged to laterally surround an entire perimeter of the p-contact interconnect 42. This may be advantageous for routing the n-contact interconnect 44 along multiple corners and lateral edges of the active LED structure mesa (60 of FIG. 4B) for improved current spreading.

Figure 12A:
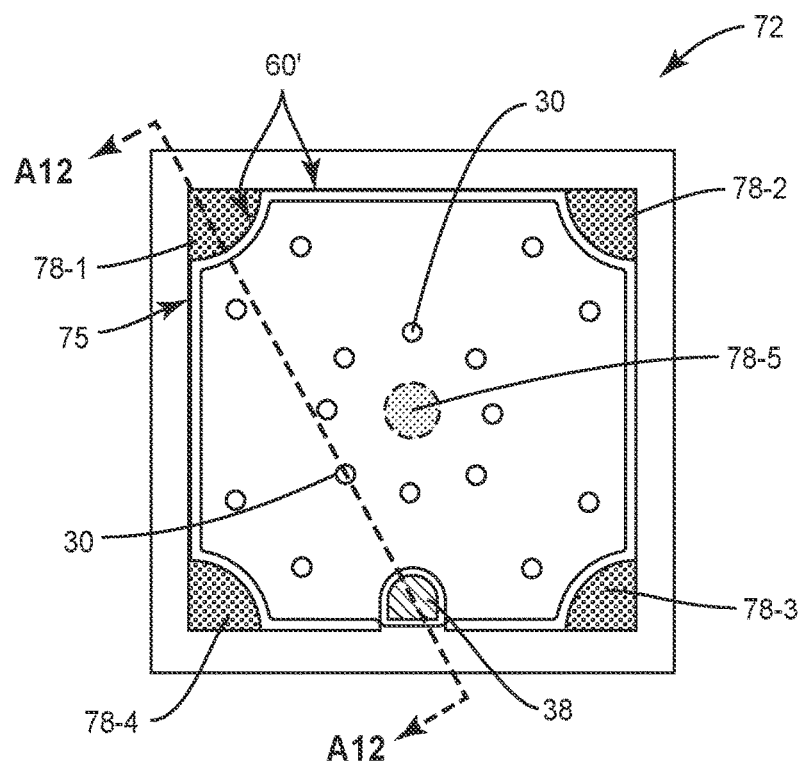
FIG. 12A is a top view of an LED chip where a growth substrate has been removed.
Figure 12B:
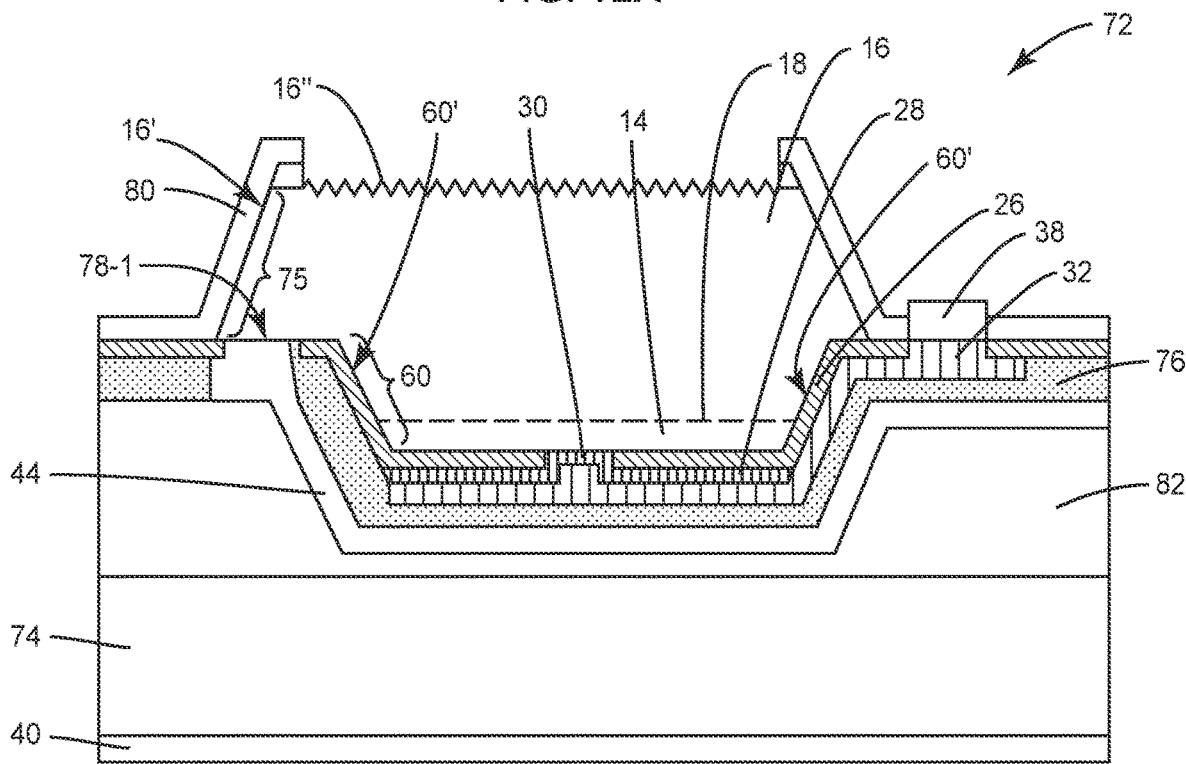
FIG. 12B is a cross-sectional view taken along the sectional line A12-A12 of FIG. 12A.

Embodiments as disclosed herein may also be suitable for other LED chip configurations, such as LED chips that are not configured for flip-chip mounting, vertical configuration LED chips, and LED chips where growth substrates have been removed. In this regard, FIG. 12A is a top view of an LED chip 72 where a growth substrate (20 of FIG. 2) has been removed. FIG. 12B is a cross-sectional view taken along the sectional line A12-A12 of FIG. 12A. The LED chip 72 includes the active LED structure mesa 60 that includes the p-type layer 14, the active layer 18, and a portion of the n-type layer 16 as previously described; however, in FIG. 12B, the active LED structure mesa 60 is flipped and mounted to a carrier submount 74. The carrier submount 74 can be made of many different materials, with a suitable material being silicon. In certain embodiments, the carrier submount 74 comprises an electrically conductive material. The growth substrate (20 of FIG. 2) has been removed and a top surface 16" of the n-type layer 16 comprises a nonplanar surface, such as a textured or patterned surface, to promote improved light extraction from the LED chip 72. The top surface 16" that comprises a textured or patterned surface is visible in FIG. 12B and is not shown in FIG. 12A for simplicity purposes; however, it is understood the textured or patterned surface would be visible in practice for a top view such as FIG. 12A. After removal of the growth substrate (20 of FIG. 2), an epitaxial layer mesa 75 is formed by an etching step. In certain embodiments, the epitaxial layer mesa 75 may be formed at the same time and with a same etch that is used to form the textured or patterned top surface 16" of the n-type layer 16. In certain embodiments, the epitaxial layer mesa 75 comprises a mesa formed in at least a portion of the n-type layer 16. The epitaxial layer mesa 75 may be referred to as a backside mesa as it is formed on an opposite side of the n-type layer 16 than the active LED structure mesa 60. The first reflective layer 26 is formed on the p-type layer 14, followed by the second reflective layer 28 as previously described. The one or more reflective layer interconnects 30 are also configured to provide electrical connections with the p-type layer 14. The barrier layer 32 is arranged on the second reflective layer 28 and the first reflective layer 26, and the barrier layer 32 further extends beyond the lateral boundaries 60' of the active LED structure mesa 60 to provide an electrical connection with the p-contact 38. In certain embodiments, the p-contact 38 is configured to receive a wire bond connection rather than the flip-chip bonding previously described. A passivation layer 76, which may include a dielectric material such as silicon nitride, may be arranged on the barrier layer 32 to provide electrical isolation. The LED chip 72 further includes the n-contact interconnect 44 that is arranged on the passivation layer 76.

As illustrated in FIGS. 12A and 12B, the n-contact interconnect 44 extends beyond the lateral boundaries 60' of the active LED structure mesa 60 to form one or more n-type layer contacts 78-1 to 78-5 that are electrically connected with the n-type layer 16. In certain embodiments, the n-contact interconnect 44 is configured to extend through one or more openings in the passivation layer 76 to electrically connect with the n-type layer 16. As illustrated, the n-type layer contacts 78-1 to 78-4 are arranged adjacent to and outside the lateral boundaries 60' of the active LED structure mesa 60. In certain embodiments, the n-type layer contacts 78-1 to 78-4 are arranged adjacent to one or more corners of the active LED structure mesa 60. In certain embodiments, the n-type layer contacts 78-1 to 78-4 may be arranged adjacent to lateral edges of the active LED structure mesa 60 as previously described. The n-type layer contact 78-5 is optional and is accordingly illustrated with a dashed line in FIG. 12A. In certain embodiments, the n-type layer contact 78-5 is arranged within the lateral boundaries 60' of the active LED structure mesa 60 in addition to the n-type layer contacts 78-1 to 78-4 that are arranged outside the lateral boundaries 60' of the active LED structure mesa 60. In this regard, a portion of the n-contact interconnect 44 may extend through a via or opening in the p-type layer 14 and the active layer 18. Additionally, a portion of the passivation layer 76 or a separate passivation layer may be provided within the via or opening to electrically insulate the n-contact interconnect 44 from the p-type layer 14 and the active layer 18. The presence of the n-type layer contact 78-5 reduces the area of the active layer 18, thereby decreasing the amount of light that may be generated by the LED chip 72. In order to promote an increase in brightness in areas of the LED chip 72 that are closest to the n-type layer contact 78-5, an increased density of the reflective layer interconnects 30 may be arranged around the n-type layer contact 78-5. In this regard, current spreading may be improved to provide improved brightness around the n-type layer contact 78-5. This type of configuration may be advantageous for larger area LED chips to further improve current spreading. In certain embodiments, the previously described LED chips (52 of FIG. 10B, 68 of FIG. 11A, and 70 of FIG. 11B) may also comprise electrical connections to the n-type layers within lateral boundaries of the active LED structure mesas. In certain embodiments, an additional passivation layer 80 may be arranged on the lateral sidewalls 16' of the n-type layer 16. The LED chip 72 may further comprise one or more bonding layers 82 for bonding with the carrier submount 74. In embodiments where the carrier submount 74 is electrically conductive, the n-contact 40 may be provided on a second face or bottom face of the carrier submount 74 that is opposite a first face or top face of the carrier submount 74 on which the active layer 18 and the active LED structure mesa 60 are provided. In such embodiments, the p-contact 38 may be configured on the first face of the carrier submount 74 and adjacent to the active LED structure mesa 60.

Figure 13:
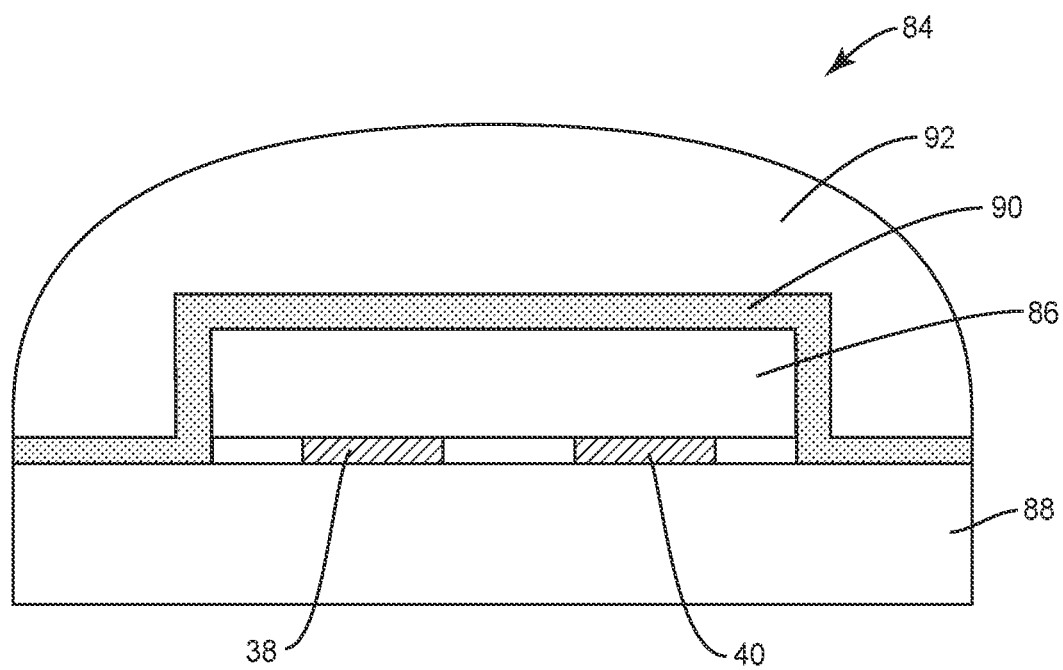
FIG. 13 is a cross-sectional view of an LED package according to embodiments disclosed herein.

LED chips as described herein may be suitable for packaging in a variety of configurations. In this regard, FIG. 13 is a cross-sectional view of an LED package 84 according to embodiments disclosed herein. The LED package 84 may include one or more LED chips 86 that may be configured similar to the previously described LED chips 52, 68, 70, or 72. The LED chip 86 is mounted to a submount 88. The submount 88 may include any number of materials, including but not limited to, alumina, AlN, silicon, and a printed circuit board. The LED package 84 may further include a lumiphoric layer 90 and an encapsulant 92. The lumiphoric layer 90 may include any of the lumiphoric materials previously described, and the encapsulant 92 may include an optically transmissive material such as silicone or glass that may be molded in the shape of a lens. In certain embodiments, the lens comprises at least one of a hemispherical shape, a hemispherical shape with planar side surfaces, or a shape with a planar top surface. In certain embodiments, the lumiphoric layer 90 is on the submount 88 outside of where the LED chip 86 is mounted. In certain embodiments, the lumiphoric layer 90 and the encapsulant 92 may be combined, for example a silicone material acting as a binder for lumiphoric materials. In FIG. 13, the LED chip 86 is flip-chip mounted to the submount 88 by way of the p-contact 38 and the n-contact 40 as previously described. In other embodiments, the LED chip 86 may be mounted to the submount 88 in a different manner as previously described. The LED chip 86 is provided with improved current spreading without reducing active area within lateral boundaries of the active LED structure mesa as previously described. Accordingly, the LED package 84 may be provided with improved brightness.

Figure 14:
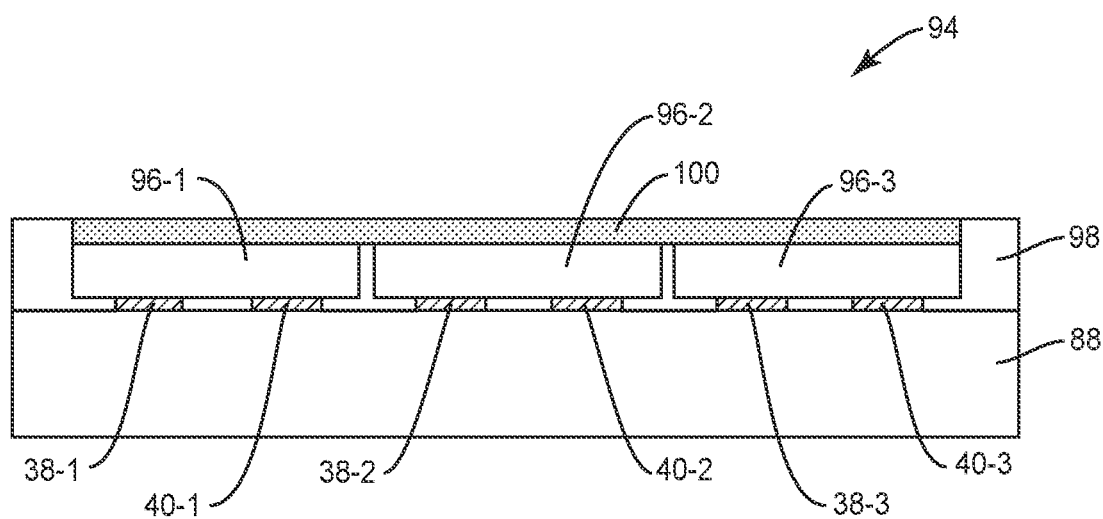
FIG. 14 is a cross-sectional view of a LED package according to embodiments disclosed herein.

FIG. 14 is a cross-sectional view of a LED package 94 according to embodiments disclosed herein. The LED package 94 includes a plurality of LED chips 96-1 to 96-3 that are mounted to the submount 88. Each of the LED chips 96-1 to 96-3 may be configured similar to the previously described LED chips 52, 68, 70, or 72. As illustrated, the LED chips 96-1 to 96-3 are flip-chip mounted to the submount 88 by way of a plurality of p-contacts 38-1 to 38-3 and a plurality of n-contacts 40-1 to 40-3, although other mounting configurations are possible. The LED package 94 further includes a light-altering material 98 arranged around a perimeter the LED chips 96-1 to 96-3 on a surface of the submount 88. In certain embodiments, the light-altering material 98 is configured to redirect or reflect laterally-emitting light from the LED chips 96-1 to 96-3 toward a desired emission direction. In other embodiments, the light-altering material 98 may block or absorb at least of portion of any laterally-emitting light from the LED chips 96-1 to 96-3 that would otherwise escape the LED package 94 with high or wide emission angles. The light-altering material 98 may be adapted for dispensing, or placing, and may include many different materials including light-reflective materials that reflect or redirect light, light-absorbing materials that absorb light, and materials that act as a thixotropic agent. In some embodiments, the light-altering material 98 may include at least one of fused silica, fumed silica, and $TiO_2$ particles suspended in a binder, such as silicone or epoxy. In some embodiments, the light-altering material 98 may comprise a white color to reflect and redirect light. In other embodiments, the light-altering material 98 may comprise an opaque or black color for absorbing light and increasing contrast of the LED package 94. The LED package 94 may further comprise a wavelength conversion element 100 that is arranged over the LED chips 96-1 to 96-3. In certain embodiments, the wavelength conversion element 100 includes one or more lumiphoric materials disposed on or within a light transmissive superstrate. In certain embodiments, the superstrate may be composed of, for example, sapphire, silicon carbide, silicone, and/or glass (e.g., borosilicate and/or fused quartz). The term "superstrate" is used herein, in part, to avoid confusion with other substrates that may be part of the semiconductor light emitting device, such as a growth or carrier substrate of the LED chip or a submount of the LED package. The term "superstrate" is not intended to limit the orientation, location, and/or composition of the structure it describes. In certain embodiments, the lumiphoric materials are arranged between the superstrate and the LED chips 96-1 to 96-3 within the wavelength conversion element 100. The LED chips 96-1 to 96-3 are provided with improved current spreading without reducing active areas within lateral boundaries of the active LED structure mesas as previously described. Accordingly, the LED package 94 may be provided with improved brightness.

Those skilled in the art will recognize improvements and modifications to the preferred embodiments of the present disclosure. All such improvements and modifications are considered within the scope of the concepts disclosed herein and the claims that follow.

What is claimed is:

1. A light emitting diode (LED) chip, comprising:
an active structure comprising an n-type layer, a p-type layer, and an active layer arranged between the n-type layer and the p-type layer, wherein the p-type layer, the active layer, and a portion of the n-type layer form an active LED structure mesa;
an n-contact and a p-contact on the active LED structure mesa;
an n-contact interconnect electrically connected between the n-contact and the n-type layer; and
a p-contact interconnect electrically connected between the p-contact and the p-type layer, wherein the n-contact interconnect is configured to laterally surround a perimeter of the p-contact interconnect across the active LED structure mesa.

2. The LED chip of claim 1, wherein the n-contact interconnect is electrically connected to the n-type layer outside a lateral boundary of the active LED structure mesa.

3. The LED chip of claim 2, wherein the n-contact interconnect electrically connects with the n-type layer adjacent to a corner of the active LED structure mesa.

4. The LED chip of claim 2, wherein the n-contact interconnect electrically connects with the n-type layer adjacent to a plurality of corners of the active LED structure mesa.

5. The LED chip of claim 2, wherein the n-contact interconnect electrically connects with the n-type layer adjacent to a corner of the active LED structure mesa and adjacent to a lateral edge of the active LED structure mesa.

6. The LED chip of claim 1, wherein the p-contact interconnect is electrically connected to the p-type layer within a lateral boundary of the active LED structure mesa.

7. The LED chip of claim 1, wherein a passivation layer is configured between at least a portion of the n-contact interconnect and the n-contact, and the passivation layer is further configured between at least a portion of the p-contact interconnect and the p-contact.

8. The LED chip of claim 7, wherein the n-contact interconnect forms an extension that is electrically connected to the n-type layer beyond a lateral boundary of the passivation layer.

9. The LED chip of claim 7, wherein the n-contact interconnect forms a plurality of extensions that are electrically connected to the n-type layer beyond a lateral boundary of the passivation layer.

10. The LED chip of claim 9, wherein at least one extension of the plurality of extensions electrically connects with the n-type layer adjacent to a lateral edge of the active LED structure mesa.

11. The LED chip of claim 9, wherein at least one extension of the plurality of extensions electrically connects with the n-type layer adjacent to a corner of the active LED structure mesa.

12. The LED chip of claim 9, wherein the plurality of extensions electrically connect with the n-type layer adjacent to a corner of the active LED structure mesa and adjacent to a lateral edge of the active LED structure mesa.

13. The LED chip of claim 9, wherein the plurality of extensions electrically connect with the n-type layer adjacent to a plurality of corners of the active LED structure mesa and adjacent to a plurality of lateral edges of the active LED structure mesa.

14. The LED chip of claim 7, wherein the n-contact interconnect is arranged to extend in a first direction within the passivation layer and a second direction within the passivation layer that is nonparallel with the first direction.

15. The LED chip of claim 1, further comprising a reflective structure on the p-type layer, wherein the reflective structure comprises a dielectric reflective layer and a metal reflective layer, and the metal reflective layer forms a plurality of reflective layer interconnects that extend through an entire thickness of the dielectric reflective layer.

16. The LED chip of claim 1, wherein the n-contact interconnect electrically connects with a surface of the n-type layer that is outside of the active LED structure mesa and the n-contact interconnect electrically connects with a lateral sidewall of the n-type layer.

17. The LED chip of claim 1, further comprising a light-transmissive substrate, wherein the active LED structure mesa is arranged between the light-transmissive substrate and both of the p-contact and the n-contact.

18. The LED chip of claim 1, wherein a surface of the n-type layer comprises a textured or patterned surface.

19. The LED chip of claim 18, further comprising a carrier submount, wherein the active LED structure mesa is on a first face of the carrier submount and the n-contact is on a second face of the carrier submount that is opposite the first face.

20. The LED chip of claim 1, wherein the n-contact interconnect entirely surrounds the p-contact interconnect across the active LED structure mesa.

* * * * *